United States Patent
Gao et al.

(10) Patent No.: US 12,469,977 B2
(45) Date of Patent: Nov. 11, 2025

(54) RADIATOR FOR TERAHERTZ ELECTROMAGNETIC RADIATION

(71) Applicant: City University of Hong Kong, Kowloon (HK)

(72) Inventors: Liang Gao, Kowloon (HK); Chi Hou Chan, Kowloon (HK)

(73) Assignee: City University of Hong Kong, Kowloon (HK)

( * ) Notice: Subject to any disclaimer, the term of this patent is extended or adjusted under 35 U.S.C. 154(b) by 258 days.

(21) Appl. No.: 18/220,976

(22) Filed: Jul. 12, 2023

(65) Prior Publication Data

US 2024/0266746 A1 Aug. 8, 2024

Related U.S. Application Data

(60) Provisional application No. 63/444,100, filed on Feb. 8, 2023.

(51) Int. Cl.
*H01Q 9/04* (2006.01)
*H01Q 21/06* (2006.01)

(52) U.S. Cl.
CPC ......... *H01Q 9/0421* (2013.01); *H01Q 9/0457* (2013.01); *H01Q 21/065* (2013.01)

(58) Field of Classification Search
CPC .. H01Q 9/0421; H01Q 9/0457; H01Q 21/065; H01Q 1/2283; H01Q 1/38; H01Q 1/36; H01Q 1/50; H01Q 21/00; H01L 23/64; H01L 25/07
See application file for complete search history.

(56) References Cited

U.S. PATENT DOCUMENTS

2024/0056285 A1* 2/2024 Tousi .................. H04L 7/033
2024/0120929 A1* 4/2024 Degani .................. G06F 1/06

OTHER PUBLICATIONS

X. Yi et al., "Emerging terahertz integrated systems in silicon," IEEE Trans. Circuits Syst. I, Reg. Papers, vol. 68, No. 9, pp. 3537-3550, Sep. 2021.
P. Hillger, J. Grzyb, R. Jain, and U. R. Pfeiffer, "Terahertz imaging and sensing applications with silicon-based technologies," IEEE Trans. THz Sci. Technol., vol. 9, No. 1, pp. 1-19, Jan. 2019.
C. Jiang et al., "A Fully Integrated 320 GHz Coherent Imaging Transceiver in 130 nm SiGe BiCMOS," IEEE J. Solid-State Circuits, vol. 51, No. 11, pp. 2596-2609, Nov. 2016.
C. Wang and R. Han, "Dual-terahertz-comb spectrometer on CMOS for rapid, wide-range gas detection with absolute specificity," IEEE J. Solid-State Circuits, vol. 52, No. 12, pp. 3361-3372, Dec. 2017.
S. Lee et al., "An 80-GB/s 300-GHz-band single-chip CMOS transceiver," IEEE J. Solid-State Circuits, vol. 54, No. 12, pp. 3577-3588, Dec. 2019.

(Continued)

*Primary Examiner* — Daniel D Chang
(74) *Attorney, Agent, or Firm* — Renner, Kenner, Greive, Bobak, Taylor & Weber

(57) ABSTRACT

A radiator for terahertz electromagnetic radiation includes one or more radiator units. Each of the one or more radiator units respectively includes: an oscillator arrangement operable to generate third harmonic power, and a patch antenna arrangement operably coupled with the oscillator arrangement for radiating terahertz electromagnetic radiation based on the generated third harmonic power.

28 Claims, 28 Drawing Sheets

(56) References Cited

OTHER PUBLICATIONS

P. Rodriguez-Vazquez, J. Grzyb, B. Heinemann and U. R. Pfeiffer, "A QPSK 110-GB/s polarization-diversity MIMO wireless link with a 220-255 GHz tunable LO in a SiGe HBT Technology," IEEE Trans. Microw. Theory Techn, vol. 68, No. 9, pp. 3834-3851, Sep. 2020.

I. Abdo et al., "A 300GHz-band phased-array transceiver using bi-directional outphasing and Hartley architecture in 65nm CMOS," in IEEE Int. Solid-State Circuits Conf. (ISSCC) Dig. Tech. Papers, San Francisco, CA, USA, Feb. 2021, pp. 316-318.

C. Wang et al., "Chip-scale molecular clock," IEEE J. Solid-State Circuits, vol. 54, No. 4, pp. 914-926, Apr. 2019.

X. Yi, C. Wang, X. Chen, J. Wang, J. Grajal and R. Han, "A 220-to-320-GHz FMCW radar in 65-nm CMOS using a frequency-comb architecture," IEEE J. Solid-State Circuits, vol. 56, No. 2, pp. 327-339, Feb. 2021.

M. I. W. Khan et al., "CMOS THz-ID: A 1.6-mm2 package-less identification tag using asymmetric cryptography and 260-GHz far-field backscatter communication," IEEE J. Solid-State Circuits, vol. 56, No. 2, pp. 340-354, Feb. 2021.

R. Al Hadi et al., "A 1 k-Pixel video camera for 0.7-1.1 terahertz imaging applications in 65-nm CMOS," IEEE J. Solid-State Circuits, vol. 47, No. 12, pp. 2999-3012, Dec. 2012.

R. Han et al., "Active terahertz imaging using Schottky diodes in CMOS: array and 860-GHz pixel," IEEE J. Solid-State Circuits, vol. 48, No. 10, pp. 2296-2308, Oct. 2013.

R. Jain et al., "A 32×32 Pixel 0.46-to-0.75THz light-field camera SoC in 0.13 μm CMOS," in IEEE Int. Solid-State Circuits Conf. (ISSCC) Dig. Tech. Papers, San Francisco, CA, USA, Feb. 2021, pp. 484-486.

K. Guo, A. Standaert, and P. Reynaert, "A 525-556-GHz radiating source with a dielectric lens antenna in 28-nm CMOS," IEEE Trans. THz Sci. Technol., vol. 8, No. 3, pp. 340-349, May 2018.

W. Steyaert and P. Reynaert, "A 0.54 THz signal generator in 40 nm bulk CMOS with 22 GHz tuning range and integrated planar antenna," IEEE J. Solid-State Circuits, vol. 49, No. 7, pp. 1617-1626, Jul. 2014.

B. Khamaisi, S. Jameson, and E. Socher, "0.61 THz radiating source with on-chip antenna on 65 nm CMOS," in Proc. 11th Eur. Microw. Integr. Circuits Conf., London, U.K., Oct. 2016, pp. 389-392.

L. Iotti, A. Mazzanti and F. Svelto, "Insights into phase-noise scaling in switch-coupled multi-core LC VCOs for E-band adaptive modulation links," IEEE J. Solid-State Circuits, vol. 52, No. 7, pp. 1703-1718, Jul. 2017.

Y. Shu, H. J. Qian, X. Gao and X. Luo, "A low phase noise and high FoM distributed-swing-boosting multi-core oscillator using harmonic-impedance-expanding technique," IEEE J. Solid-State Circuits, vol. 56, No. 12, pp. 3728-3740, Dec. 2021.

H. Jia, R. Ma, W. Deng, Z. Wang and B. Chi, "A 53.6-to-60.2GHz many-core fundamental oscillator with scalable mesh topology achieving -136.0dBc/Hz phase noise at 10MHz offset and 190.3dBc/Hz peak FoM in 65nm CMOS," in IEEE Int. Solid-State Circuits Conf. (ISSCC) Dig. Tech. Papers, San Francisco, CA, USA, Feb. 2022, pp. 154-156.

L. Gao and C. H. Chan, "A 0.47-THz ring scalable coupled oscillator-radiator array with miniature patch antennas," IEEE Trans. Microw. Theory Techn., vol. 70, No. 8, pp. 3964-3974, Aug. 2022.

H. Saeidi, S. Venkatesh, C. R. Chappidi, T. Sharma, C. Zhu and K. Sengupta, "A 4×4 steerable 14-dBm EIRP array on CMOS at 0.41 THz with a 2-D distributed oscillator network," IEEE J. Solid-State Circuits, vol. 57, No. 10, pp. 3125-3138, Oct. 2022.

L. Gao, H. Zhou, K. M. Shum, and C. H. Chan, "A 482-GHz 2-D scalable and wideband radiator array," IEEE Microw. Wirel. Compon. Lett., vol. 31, No. 9, pp. 1090-1093, Sep. 2021.

Y. Tousi and E. Afshari, "A high-power and scalable 2-D phased array for terahertz CMOS integrated systems," IEEE J. Solid-State Circuits, vol. 50, No. 2, pp. 597-609, Feb. 2015.

H. Jalili and O. Momeni, "A standing-wave architecture for scalable and wideband millimeter-wave and terahertz coherent radiator arrays," IEEE Trans. Microw. Theory Techn., vol. 66, No. 3, pp. 1597-1609, Mar. 2018.

H. Jalili and O. Momeni, "A 0.34-THz wideband wide-angle 2-D steering phased array in 0.13-μm SiGe BiCMOS," IEEE J. Solid-State Circuits, vol. 54, No. 9, pp. 2449-2461, Sep. 2019.

L. Gao and C. H. Chan, "A 0.45-THz 2-D scalable radiator array with 28.2-dBm EIRP using an elliptical Teflon lens," IEEE J. Solid-State Circuits, vol. 57, No. 2, pp. 400-412, Feb. 2022.

H. Jalili and O. Momeni, "A 0.46-THz 25-element scalable and wideband radiator array with optimized lens integration in 65-nm CMOS," IEEE J. Solid-State Circuits, vol. 55, No. 9, pp. 2387-2400, Sep. 2020.

Y. Zhao et al., "A 0.54-0.55 THz 2×4 coherent source array with EIRP of 24.4 dBm in 65nm CMOS technology," in IEEE MTT-S Int. Microw. Symp. Dig., Phoenix, AZ, USA, May 2015, pp. 1-3.

L. Gao and C. H. Chan, "A 0.68-0.72-THz 2-D scalable radiator array with -3-dBm radiated power and 27.3-dBm EIRP in 65-nm CMOS," IEEE J. Solid-State Circuits, vol. 57, No. 10, pp. 3114-3124, Oct. 2022.

N. Buadana, S. Jameson, and E. Socher, "A multiport chip-scale dielectric resonator antenna for CMOS THz transmitters," IEEE Trans. Microw. Theory Techn., vol. 68, No. 9, pp. 3621-3632, Sep. 2020.

K. Guo and P. Reynaert, "A 0.59THz beam-steerable coherent radiator array with 1mW radiated power and 24.1dBm EIRP in 40nm CMOS," in IEEE Int. Solid-State Circuits Conf. (ISSCC) Dig. Tech. Papers, San Francisco, CA, USA, Feb. 2020, pp. 442-444.

G. Guimarães and P. Reynaert, "A 670-GHz 4×2 oscillator-radiator Array Achieving 7.4-dBm EIRP in 40-nm CMOS," IEEE J. Solid-State Circuits, vol. 56, No. 11, pp. 3399-3411, Nov. 2021.

Z. Hu, M. Kaynak, and R. Han, "High-power radiation at 1 THz in silicon: A fully scalable array using a multi-functional radiating mesh structure," IEEE J. Solid-State Circuits, vol. 53, No. 5, pp. 1313-1327, May 2018.

R. Han et al., "A SiGe terahertz heterodyne imaging transmitter with 3.3 mW radiated power and fully-integrated phase-locked loop," IEEE J. Solid-State Circuits, vol. 50, No. 12, pp. 2935-2947, Dec. 2015.

S. Razavian and A. Babakhani, "A highly power efficient 2×3 PIN-diode-based intercoupled THz radiating array at 425GHz with 18.1dBm EIRP in 90nm SiGe BiCMOS," in IEEE Int. Solid-State Circuits Conf. (ISSCC) Dig. Tech. Papers, San Francisco, CA, USA, Feb. 2022, pp. 1-3.

L. Gao and C. H. Chan, "A 0.64-to-0.69THz beam-steerable coherent source with 9.1dBm radiated power and 30.8dBm EIRP in 65nm CMOS," in IEEE Int. Solid-State Circuits Conf. (ISSCC) Dig. Tech. Papers, San Francisco, CA, USA, Feb. 2023, pp. 362-364.

R. Jain, P. Hillger, J. Grzyb and U. R. Pfeiffer, "A 0.42THz 9.2dBm 64-pixel source-array SoC with spatial modulation diversity for computational terahertz imaging," in IEEE Int. Solid-State Circuits Conf. (ISSCC) Dig. Tech. Papers, San Francisco, CA, USA, Feb. 2020, pp. 440-442.

Y. Yang, O. D. Gurbuz and G. M. Rebeiz, "An eight-element 370-410-GHz phased-array transmitter in 45-nm CMOS SOI with peak EIRP of 8-8.5 dBm," IEEE Trans. Microw. Theory Techn, vol. 64, No. 12, pp. 4241-4249, Dec. 2016.

K. Guo, Y. Zhang and P. Reynaert, "A 0.53-THz subharmonic injection-locked phased array with 63-μW radiated power in 40-nm CMOS," IEEE J. Solid-State Circuits, vol. 54, No. 2, pp. 380-391, Feb. 2019.

R. A. York, "Nonlinear analysis of phase relationships in quasi-optical oscillator arrays," IEEE Trans. Microw. Theory Techn, vol. 41, No. 10, pp. 1799-1809, Oct. 1993.

H. Wang, J. Chen, J. T. S. Do, H. Rashtian, and X. Liu, "High-efficiency millimeter-wave single-ended and differential fundamental oscillators in CMOS," IEEE J. Solid-State Circuits, vol. 53, No. 8, pp. 2151-2163, Aug. 2018.

R. Kananizadeh and O. Momeni, "High-power and high-efficiency millimeter-wave harmonic oscillator design, exploiting harmonic positive feedback in CMOS," IEEE Trans. Microw. Theory Techn, vol. 65, No. 10, pp. 3922-3936, Oct. 2017.

(56) References Cited

OTHER PUBLICATIONS

R. Han and E. Afshari, "A Cmos high-power broadband 260-GHz radiator array for spectroscopy," IEEE J. Solid-State Circuits, vol. 48, No. 12, pp. 3090-3104, Dec. 2013.
H. Saeidi et al., "A 4×4 Distributed Multi-Layer Oscillator Network for Harmonic Injection and THz Beamforming with 14dBm EIRP at 416GHz in a Lensless 65nm CMOS IC," ISSCC, pp. 256-258, Feb. 2020.

\* cited by examiner

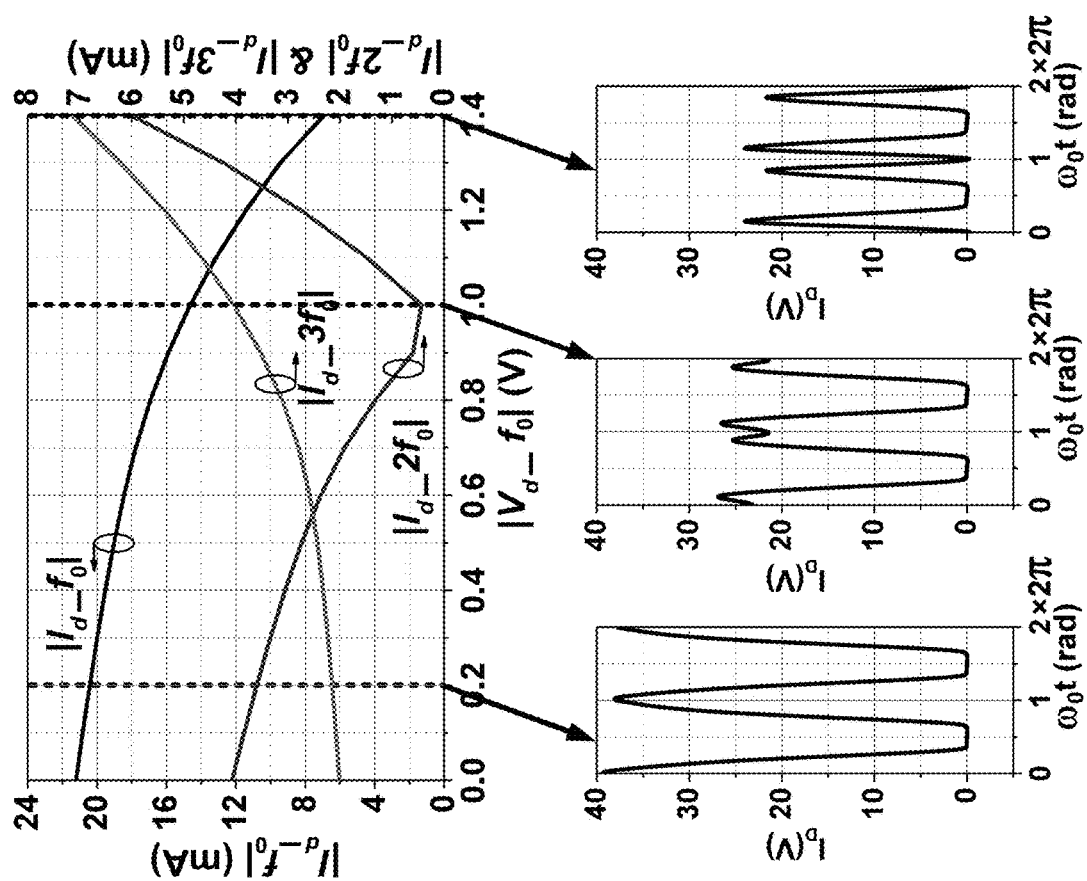
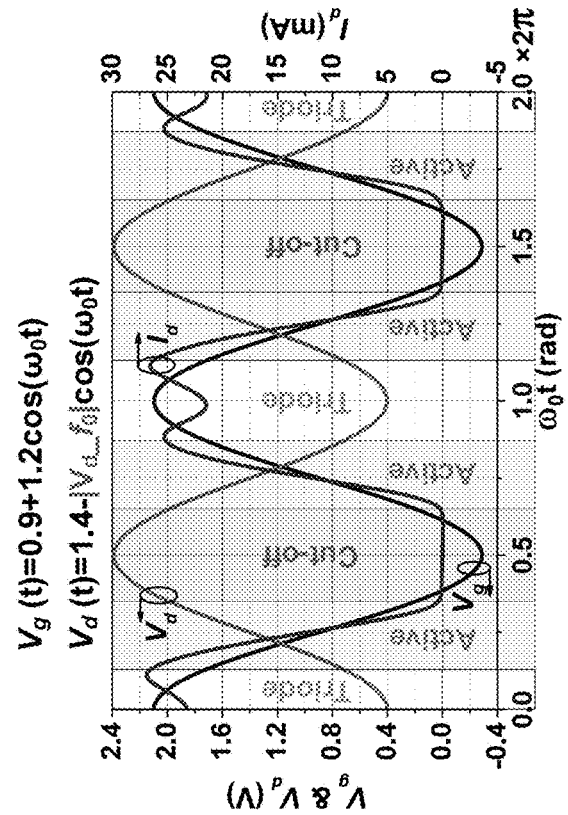
Fig. 7B
Fig. 7A

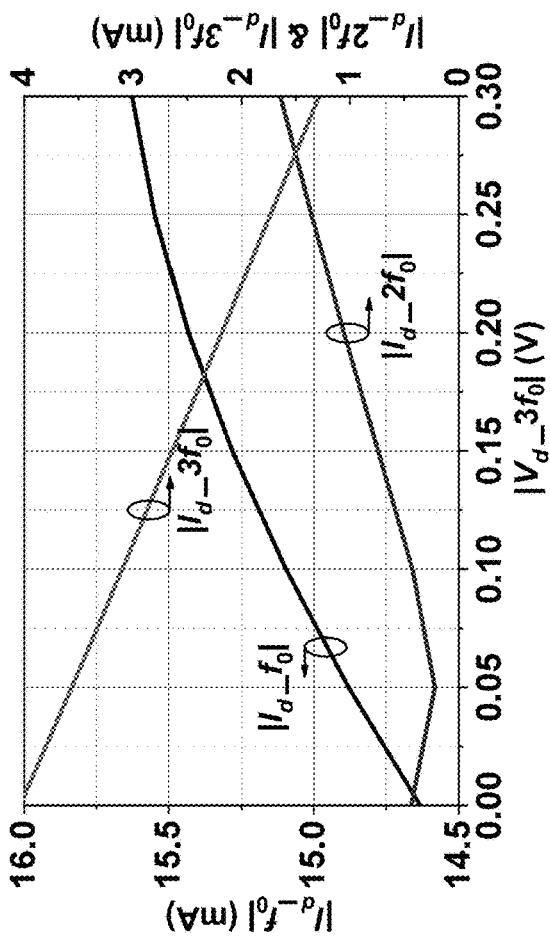
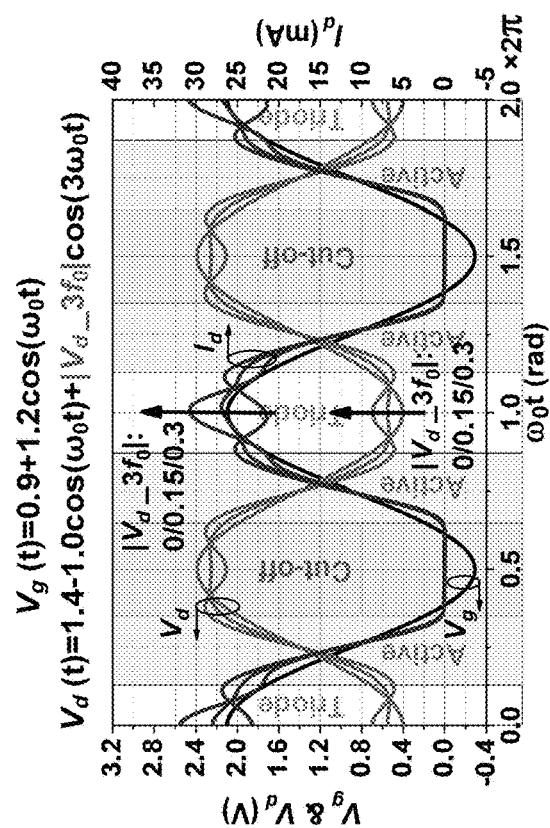
Fig. 9A
Fig. 9B

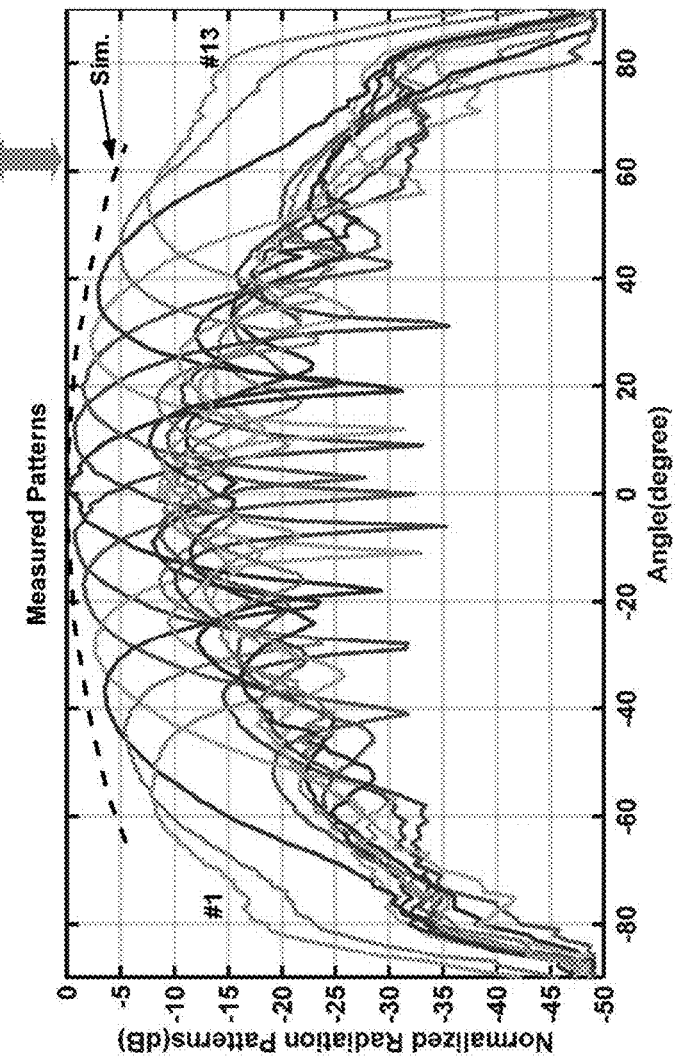
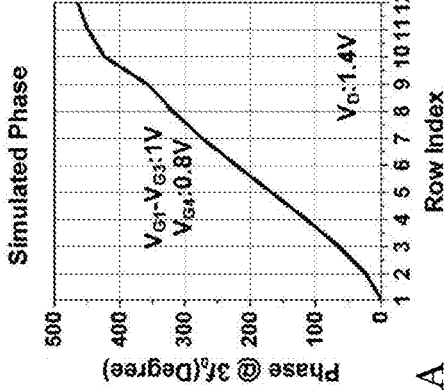
Fig. 24A
Fig. 24B
Fig. 24C

RADIATOR FOR TERAHERTZ ELECTROMAGNETIC RADIATION

CROSS REFERENCE TO RELATED APPLICATION

This application claims the priority and benefit of U.S. provisional patent application No. 63/444,100, filed on Feb. 8, 2023, the entire content of which is incorporated herein by reference.

TECHNICAL FIELD

The invention relates to a radiator for terahertz (THz) electromagnetic radiation.

BACKGROUND

Electromagnetic radiation at terahertz frequency band may be used in various applications such as imaging, spectroscopy, communication, etc.

Some existing devices for generating electromagnetic radiation at the terahertz frequency band are silicon-based devices (e.g., silicon-based arrays). Problematically, as the terahertz frequency band usually lies beyond the maximum oscillation frequency in silicon, these existing devices may suffer from heating and/or efficiency problems.

SUMMARY OF THE INVENTION

In a first aspect, there is provided a radiator for terahertz electromagnetic radiation. The radiator comprises one or more radiator units. Each of the one or more radiator units respectively comprises: an oscillator arrangement operable to generate third harmonic power, and a patch antenna arrangement operably coupled with the oscillator arrangement for radiating terahertz electromagnetic radiation based on the generated third harmonic power.

The terahertz electromagnetic radiation provided by the radiator may be in the range from about 0.1 THz to about 10 THz. In some embodiments, the terahertz electromagnetic radiation is from about 0.2 THz to about 5 THz. In some embodiments, the terahertz electromagnetic radiation is from about 0.3 THz to about 3 THz. In some embodiments, the terahertz electromagnetic radiation is from about 0.3 THz to about 1 THz. In some embodiments, the terahertz electromagnetic radiation is from about 0.4 THz to about 0.8 THz. In some embodiments, the terahertz electromagnetic radiation is from about 0.4 THz to about 0.7 THz. In some embodiments, the terahertz electromagnetic radiation is from about 0.6 THz to about 0.7 THz. In some embodiments, the terahertz electromagnetic radiation is from about 0.64 THz to about 0.69 THz.

In some embodiments, the oscillator arrangement comprises: a first oscillator operable to generate third harmonic power, a second oscillator operable to generate third harmonic power, and a coupler electrically coupling the first oscillator and the second oscillator.

In some embodiments, the coupler comprises an even-mode-shorted coupler for enabling or sustaining an out-of-phase coupling mode between the first oscillator and the second oscillator.

In some embodiments, the even-mode-shorted coupler comprises: a transmission line arrangement electrically connected between the first oscillator and the second oscillator, and a capacitive arrangement electrically connected with the transmission line arrangement and operable to facilitate shorting of even-mode impedance. In some examples, the transmission line arrangement may comprise, or consist only of, a transmission line. In some examples, the transmission line may be straight. In some examples, the capacitive arrangement may comprise, or consist only of, a capacitor. In some examples, the transmission line has a length, and the capacitor is electrically connected at or near a middle of the length of the transmission line.

In some embodiments, the first oscillator and the second oscillator are arranged to differentially feed the patch antenna arrangement.

In some embodiments, the patch antenna arrangement comprises: a first patch element operably coupled with the first oscillator and the second oscillator, and a second patch element operably coupled with the first oscillator and the second oscillator. In some examples, the first patch element and the second patch element may be generally identical in terms of shape and size and material.

In some embodiments, each of the first oscillator and the second oscillator respectively comprises a transistor arrangement. In other words, the first oscillator has a transistor arrangement and the second oscillator has a (i.e., another) transistor arrangement. In some embodiments, the transistor arrangement comprises: a first transistor with a gate terminal, a source terminal, and a drain terminal, and a second transistor with a gate terminal, a source terminal, and a drain terminal. The first transistor and the second transistor are operably coupled to operate in phase.

The first transistor and the second transistor may each respectively be a solid-state electronic device such as a silicon-based solid-state electronic device. For example, the first transistor and the second transistor may each be a field effect transistor (FET). The first transistor and the second transistor may each respectively be arranged (e.g., controlled) to selectively operate in an active region, a cut-off region, and a triode region for facilitating generation of the third harmonic power.

In some embodiments, the gate terminal of the first transistor and the gate terminal of the second transistor are electrically connected with each other.

In some embodiments, the source terminal of the first transistor and the source terminal of the second transistor are electrically connected with each other.

In some embodiments, the gate terminal of the first transistor and the gate terminal of the second transistor are electrically connected with the even-mode-shorted coupler.

In some embodiments, each of the first oscillator and the second oscillator respectively further comprises: a first circuit arrangement electrically connected with the source terminal of the first transistor, a second circuit arrangement electrically connected with the source terminal of the second transistor, a third circuit arrangement electrically connected with the drain terminal of the first transistor and operably coupled with the patch antenna arrangement (e.g., with the first patch element), and a fourth circuit arrangement electrically connected with the drain terminal of the second transistor and operably coupled with the patch antenna arrangement (e.g., with the second patch element). In other words, the first oscillator has its own first to fourth circuit arrangements and the second oscillator has its own first to fourth circuit arrangements.

In some embodiments, the first circuit arrangement comprises a capacitive arrangement for facilitating oscillation and a transmission line arrangement for power supply. The capacitive arrangement and the transmission line arrangement of the first circuit arrangement are arranged electrically in parallel. In some examples, the capacitive arrangement of the first circuit arrangement is grounded. In some examples, the capacitive arrangement of the first circuit arrangement comprises, or consists only of, a capacitor. In some examples, the transmission line arrangement of the first circuit arrangement is grounded. In some examples, the transmission line arrangement of the first circuit arrangement comprises, or consists only of, a curved transmission line. In some examples, the curved transmission line is a wavy transmission line with multiple bends.

In some embodiments, the second circuit arrangement comprises a capacitive arrangement for facilitating oscillation and a transmission line arrangement for power supply. The capacitive arrangement and the transmission line arrangement of the second circuit arrangement are arranged electrically in parallel. In some examples, the capacitive arrangement of the second circuit arrangement is grounded. In some examples, the capacitive arrangement of the second circuit arrangement comprises, or consists only of, a capacitor. In some examples, the transmission line arrangement of the second circuit arrangement is grounded. In some examples, the transmission line arrangement of the second circuit arrangement comprises, or consists only of, a curved transmission line. In some examples, the curved transmission line is a wavy transmission line with multiple bends.

In some embodiments, the third circuit arrangement comprises: a transmission line arrangement operably coupled with the patch antenna arrangement and an AC short termination arrangement electrically connected with the transmission line arrangement. In some examples, the AC short termination arrangement of the third circuit arrangement comprises a grounded capacitive arrangement electrically connected in series with the transmission line arrangement. In some examples, the grounded capacitive arrangement comprises, or consists only of, a grounded capacitor. In some examples, the transmission line arrangement of the third circuit arrangement comprises, or consists only of: a first transmission line portion with an end electrically connected in series with the AC short termination arrangement, and a second transmission line portion extending from the first transmission line portion and electrically coupled with the patch antenna arrangement for capacitively feeding the patch antenna arrangement. A DC supply voltage may be applied between the first transmission line portion and the AC short termination arrangement. In some examples, the first transmission line portion is straight. In some examples, the second transmission line portion is straight. In some examples, the first and second transmission line portions are generally perpendicular.

In some embodiments, the fourth circuit arrangement comprises: a transmission line arrangement operably coupled with the patch antenna arrangement and an AC short termination arrangement electrically connected with the transmission line arrangement. In some examples, the AC short termination arrangement of the fourth circuit arrangement comprises a grounded capacitive arrangement electrically connected in series with the transmission line arrangement. In some examples, the grounded capacitive arrangement comprises, or consists only of, a grounded capacitor. In some examples, the transmission line arrangement of the fourth circuit arrangement comprises, or consists only of: a first transmission line portion with an end electrically connected in series with the AC short termination arrangement, and a second transmission line portion extending from the first transmission line portion and electrically coupled with the patch antenna arrangement for capacitively feeding the patch antenna arrangement. A DC supply voltage may be applied between the first transmission line portion and the AC short termination arrangement. In some examples, the first transmission line portion is straight. In some examples, the second transmission line portion is straight. In some examples, the first and second transmission line portions are generally perpendicular.

In some embodiments, the transmission line arrangement of the first circuit arrangement and the transmission line arrangement of the second circuit arrangement are generally symmetrically disposed about an axis of reflection symmetry. The axis of reflection symmetry may be parallel to or collinear with a long axis of the transmission line of the even-mode-shorted coupler.

In some embodiments, the transmission line arrangement of the third circuit arrangement and the transmission line arrangement of the fourth circuit arrangement are generally symmetrically disposed about an axis of reflection symmetry. The axis of reflection symmetry may be parallel to or collinear with a long axis of the transmission line of the even-mode-shorted coupler.

In some embodiments, the patch antenna arrangement comprises an on-chip patch antenna arrangement.

In some embodiments, the first patch element is electrically coupled (e.g., capacitively coupled) with the third circuit arrangement of the first oscillator and the third circuit arrangement of the second oscillator.

In some embodiments, the second patch element is electrically coupled (e.g., capacitively coupled) with the fourth circuit arrangement of the first oscillator and the fourth circuit arrangement of the second oscillator.

In some embodiments, the first transistor of the first oscillator and the first transistor of the second oscillator are arranged to selectively or alternately provide third harmonic power to the first patch element. For example, in one cycle, the first transistor of the first oscillator may provide third harmonic power to the first patch element for about half of the cycle (cumulatively or continuously), and the first transistor of the second oscillator may provide third harmonic power to the first patch element for about another half of the cycle (cumulatively or continuously).

In some embodiments, the second transistor of the first oscillator and the second transistor of the second oscillator are arranged to selectively or alternately provide third harmonic power to the second patch element. For example, in one cycle, the second transistor of the first oscillator may provide third harmonic power to the second patch element for about half of the cycle (cumulatively or continuously), and the second transistor of the second oscillator may provide third harmonic power to the second patch element for about another half of the cycle (cumulatively or continuously).

In some embodiments, the first patch element belongs to a portion (e.g., half) of a larger patch.

In some embodiments, the second patch element belongs to a portion (e.g., half) of a larger patch.

In some embodiments, in plan view, the transmission line of the even-mode-shorted coupler is disposed between the first patch element and the second patch element.

In some embodiments, in plan view, the first patch element and the second patch element are generally symmetrically disposed about an axis of reflection symmetry. The axis of reflection symmetry may be parallel to or collinear with a long axis of the transmission line of the even-mode-shorted coupler.

In some embodiments, in plan view, the first oscillator and the second oscillator are generally symmetrically disposed about an axis of reflection symmetry. The axis of reflection symmetry may be an axis that bisects each of the first patch element and the second patch element.

In some embodiments, the one or more radiator units include a plurality of radiator units operably coupled with each other.

In some embodiments, the plurality of radiator units are arranged in an array with one or more rows.

In some embodiments, the plurality of radiator units are arranged in an array with a plurality of rows each including at least one radiator unit, and all of the first oscillators and the second oscillators of the plurality of radiator units form a plurality of rows of oscillators and a plurality of columns of oscillators. In some embodiments, the number of rows of oscillators and the number of columns of oscillators are the same. In some embodiments, the number of rows of oscillators and the number of columns of oscillators are different.

In some embodiments, the plurality of radiator units comprises, at least, a first radiator unit and a second radiator unit arranged in the same row, and, the radiator comprises a coupling arrangement electrically coupling the first radiator unit and the second radiator unit in the same row.

In some embodiments, the coupling arrangement (that electrically couples the first radiator unit and the second radiator unit in the same row) comprises an even-mode-shorted coupler for enabling or sustaining an out-of-phase coupling mode between (i) the first oscillator of one of the first radiator unit and the second radiator unit and (ii) the second oscillator of another one of the first radiator unit and the second radiator unit.

In some embodiments, the even-mode-shorted coupler of the coupling arrangement comprises: a transmission line arrangement electrically connected between (i) the first oscillator of one of the first radiator unit and the second radiator unit and (ii) the second oscillator of another one of the first radiator unit and the second radiator unit, and a capacitive arrangement electrically connected with the transmission line arrangement and operable to facilitate shorting of an even-mode impedance. In some examples, the transmission line arrangement may comprise, or consist only of, a transmission line. In some examples, the transmission line may be straight. In some examples, the capacitive arrangement may comprise, or consist only of, a capacitor. In some examples, the transmission line has a length, and the capacitor is electrically connected at or near a middle of the length of the transmission line. In some examples, the even-mode-shorted coupler is electrically connected either (i) between the gate terminals of the first and second transistors of the second oscillator of the first radiator unit and the gate terminals of the first and second transistors of the first oscillator of the second radiator unit, or (ii) between the gate terminals of the first and second transistors of the first oscillator of the first radiator unit and the gate terminals of the first and second transistors of the second oscillator of the second radiator unit.

In some embodiments, the plurality of radiator units comprises, at least, a first radiator unit and a second radiator unit arranged in adjacent rows, and the radiator comprises a coupling arrangement electrically coupling the first radiator unit and the second radiator unit in adjacent rows.

In some embodiments, the coupling arrangement (that electrically couples the first radiator unit and the second radiator unit adjacent rows) comprises: a first coupler electrically connected between the first oscillator of the first radiator unit and the first oscillator of the second radiator unit, and a second coupler electrically connected between the second oscillator of the first radiator unit and the second oscillator of the second radiator unit.

In some embodiments, the first coupler comprises a first odd-mode-shorted coupler for enabling or sustaining an in-phase coupling mode between the first oscillator of the first radiator unit and the first oscillator of the second radiator unit, and the second coupler comprises a second odd-mode-shorted coupler for enabling or sustaining an in-phase coupling mode between the second oscillator of the first radiator unit and the second oscillator of the second radiator unit.

In some embodiments, the first odd-mode-shorted coupler comprises: a transmission line arrangement electrically connected between the first oscillator of the first radiator unit and the first oscillator of the second radiator unit; a first capacitive arrangement electrically connected between the transmission line arrangement and the first oscillator of the first radiator unit and operable to facilitate shorting of an odd-mode impedance; and a second capacitive arrangement electrically connected between the transmission line arrangement and the first oscillator of the second radiator unit and operable to facilitate shorting of an odd-mode impedance. In some examples, the transmission line arrangement comprises, or consists only of, a transmission line. In some examples, the transmission line is straight. In some examples, the first capacitive arrangement comprises, or consists only of, a capacitor. In some examples, the second capacitive arrangement comprises, or consists only of, a capacitor. In some examples, the first odd-mode-shorted coupler is electrically connected between the source terminal of the second transistor of the first oscillator of the first radiator unit and the source terminal of the first transistor of the first oscillator of the second radiator unit.

In some embodiments, the second odd-mode-shorted coupler comprises: a transmission line arrangement electrically connected between the second oscillator of the first radiator unit and the second oscillator of the second radiator unit; a first capacitive arrangement electrically connected between the transmission line arrangement and the second oscillator of the first radiator unit and operable to facilitate shorting of an odd-mode impedance; and a second capacitive arrangement electrically connected between the transmission line arrangement and the second oscillator of the second radiator unit and operable to facilitate shorting of an odd-mode impedance. In some examples, the transmission line arrangement comprises, or consists only of, a transmission line. In some examples, the transmission line is straight. In some examples, the first capacitive arrangement comprises, or consists only of, a capacitor. In some examples, the second capacitive arrangement comprises, or consists only of, a capacitor. In some examples, the second odd-mode-shorted coupler is electrically connected between the source terminal of the second transistor of the second oscillator of the first radiator unit and the source terminal of the first transistor of the second oscillator of the second radiator unit.

In some embodiments, the plurality of radiator units are arranged in an array with a plurality of rows each including at least one radiator unit. In some embodiments, the array comprises, or consists only of, a plurality of subarrays each including some of the plurality of rows. In some embodiments, each of the plurality of subarrays is arranged to be subjected to a respective bias voltage. The bias voltage may affect one or more properties of the terahertz electromagnetic radiation provided by the radiator. The one or more properties of the terahertz electromagnetic radiation may include one or more of: radiation pattern, direction, etc. In some embodiments, the bias voltages applied to at least two of the plurality of subarrays are different. In some embodiments, the bias voltages applied to all of the plurality of subarrays are different.

In some embodiments, the radiator is fabricated using CMOS technologies, such as 65 nm CMOS process/technology.

In some embodiments, the radiator is arranged in, or formed in, an integrated circuit (chip). The terahertz electromagnetic radiation may radiate from one side (e.g., the front side) of the integrated circuit.

In some embodiments, the radiator is a terahertz radiator configured for terahertz electromagnetic radiation only. In some embodiments, the radiator is configured for terahertz electromagnetic radiation as well as for electromagnetic radiation at one or more other frequencies or frequency bands. In some embodiments in which the radiator is configured for providing terahertz electromagnetic radiation as well as electromagnetic radiation in one or more other frequencies or frequency bands, the radiator may operate best for providing terahertz electromagnetic radiation.

In a second aspect, there is provided an integrated circuit comprising at least one of the radiator of the first aspect.

In a third aspect, there is provided a device comprising at least one of the radiator of the first aspect.

In some embodiments, the device further comprises a thermal management device thermally coupled with the radiator for regulating temperature of the radiator (e.g., for facilitating heat dissipation from the radiator). In some embodiments in which the radiator is arranged or formed in an integrated circuit (chip), the thermal management device may be coupled to a back side of the integrated circuit. In some examples, the thermal management device comprises a passive thermal management device. For example, the passive thermal management device may include a heat sink with fins, pins, etc. In some examples, the thermal management device comprises an active thermal management device. For example, the active thermal management device may include a fan, a liquid-based heat exchange device, an evaporative heat exchanger, etc.

In some embodiments, the device lacks any lens disposed relative to the radiator for affecting (e.g., boosting) directivity of the terahertz electromagnetic radiation provided by the radiator.

In a fourth aspect, there is provided a system for providing terahertz electromagnetic radiation comprising at least one of the radiator of the first aspect. The system may be a sensing system, a communication system, a spectroscopic system, an imaging system, etc. In one example, the system is an active terahertz imaging system arranged to illuminate objects (e.g., targeted objects). In one example, the system is a cellular (e.g., 5G, 6G, above 6G, or the like) communication system.

In a fifth aspect, there is provided a system for providing terahertz electromagnetic radiation comprising at least one of the integrated circuit of the second aspect. The system may be a sensing system, a communication system, a spectroscopic system, an imaging system, etc. In one example, the system is an active terahertz imaging system arranged to illuminate objects (e.g., targeted objects). In one example, the system is a cellular (e.g., 5G, 6G, above 6G, or the like) communication system.

In a sixth aspect, there is provided a system for providing terahertz electromagnetic radiation comprising at least one of the device of the third aspect. The system may be a sensing system, a communication system, a spectroscopic system, an imaging system, etc. In one example, the system is an active terahertz imaging system arranged to illuminate objects (e.g., targeted objects). In one example, the system is a cellular (e.g., 5G, 6G, above 6G, or the like) communication system.

Other features and aspects of the invention will become apparent by consideration of the detailed description and accompanying drawings. Any feature(s) described herein in relation to one aspect or embodiment may be combined with any other feature(s) described herein in relation to any other aspect or embodiment as appropriate and applicable.

Terms of degree such that "generally", "about", "substantially", or the like, are used, depending on context, to account for manufacture tolerance, degradation, trend, tendency, imperfect practical condition(s), etc. For example, when a value is modified by terms of degree, such as "about", such expression may include the stated value ±10%, ±5%, ±2%, or ±1%.

Unless otherwise specified, the terms "connected", "coupled", "mounted" or the like, are intended to encompass both direct and indirect connection, coupling, mounting, etc.

BRIEF DESCRIPTION OF THE DRAWINGS

Embodiments of the invention will now be described, by way of example, with reference to the accompanying drawings, in which:

FIG. 7A is a graph showing simulated drain current waveform (under given DC bias and fundamental driving voltages) and corresponding gate and drain voltage waveforms obtained from the transistor;

FIG. 7B is a graph showing simulated harmonic currents at the drain terminal of the transistor under different fundamental voltages at the drain terminal of the transistor, and three corresponding current waveforms at selected fundamental voltage $|V_{d\_f_0}|$;

FIG. 9A is a graph showing simulated drain current waveforms (obtained by varying the third harmonic voltage $|V_{d\_}3f_0|$) and corresponding gate and drain voltage waveforms obtained from the transistor;

FIG. 9B is a graph showing simulated harmonic currents at the drain terminal of the transistor under different third harmonic drain voltages $|V_{d\_}3f_0|$ at the drain terminal of the transistor;

FIG. 24A is a graph showing simulated phase for the 12×12 coupled oscillator array of FIG. 15 when $V_{G1}$ to $V_{G3}$ are set to 1V and $V_{G2}$ is set to 0.8V;

FIG. 24B is a table showing the bias settings for measuring radiation patterns of the 12×12 coupled oscillator array of FIG. 15;

FIG. 24C is a graph showing measured steerable radiation patterns of the 12×12 coupled oscillator array of FIG. 15 obtained based on the bias settings in FIG. 24B;

DETAILED DESCRIPTION

Figure 25:
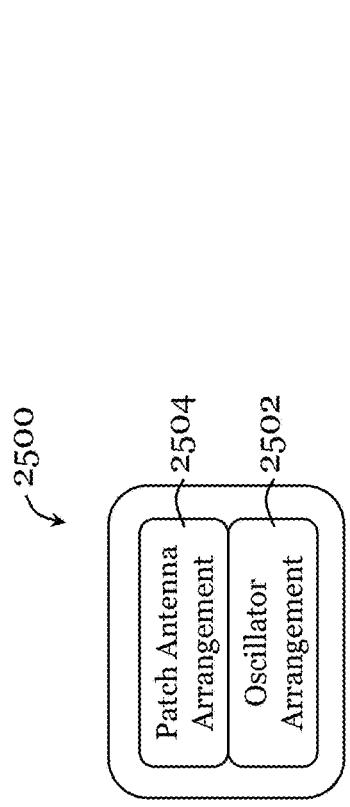
FIG. 25 is a schematic diagram illustrating a radiator unit of a radiator for terahertz electromagnetic radiation in some embodiments of the invention.

FIG. 25 shows a radiator unit 2500 of a radiator for terahertz electromagnetic radiation in some embodiments of the invention.

The radiator unit 2500 generally includes an oscillator arrangement 2502 and a patch antenna arrangement 2504. The oscillator arrangement 2502 is operable to generate third harmonic power (e.g., in the form of electric current or voltage). The patch antenna arrangement 2504 is operably coupled with the oscillator arrangement 2502 for radiating terahertz electromagnetic radiation based on the third harmonic power generated by the oscillator arrangement 2502. The oscillator arrangement 2502 may include one or more oscillators, such as one or more transistor-based oscillators. The patch antenna arrangement 2504 may include one or more patch antennas. In some embodiments, the terahertz electromagnetic radiation radiated by the patch antenna arrangement 2504 may be in the range: from about 0.1 THz to about 10 THz, from about 0.2 THz to about 5 THz, from about 0.3 THz to about 3 THz, from about 0.3 THz to about 1 THz, from about 0.4 THz to about 0.8 THz, from about 0.4 THz to about 0.7 THz, from about 0.6 THz to about 0.7 THz, or from about 0.64 THz to about 0.69 THz, etc.

Figure 26:
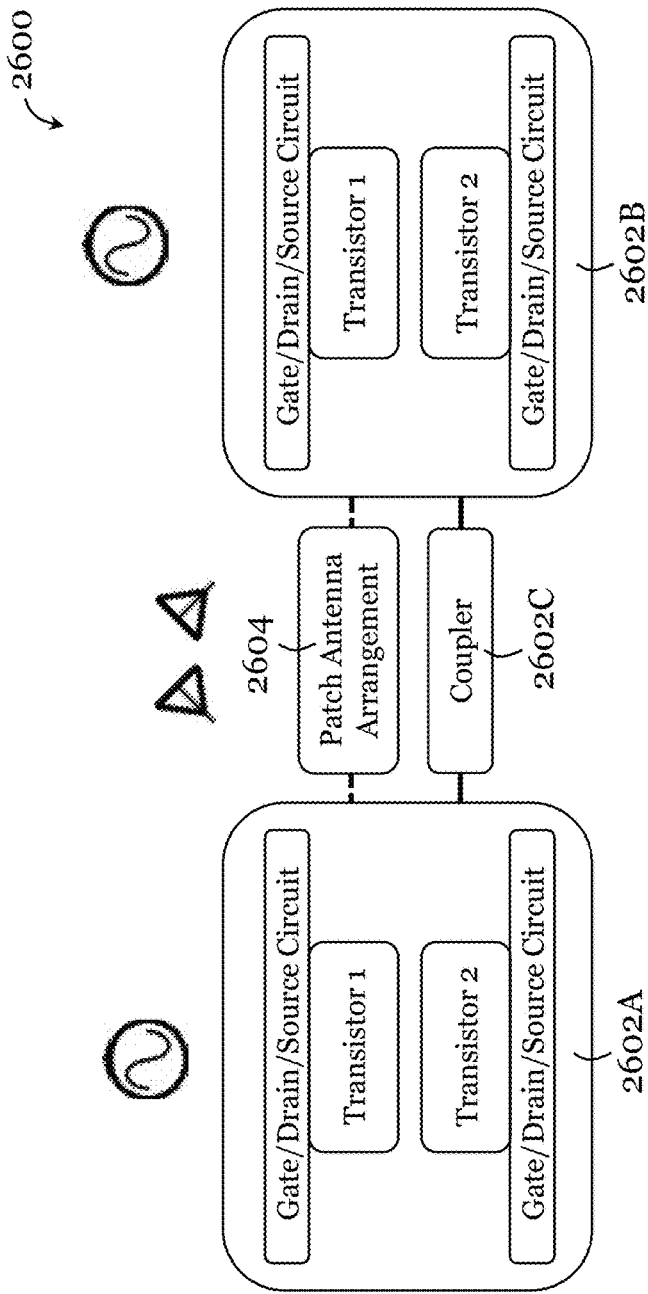
FIG. 26 is a schematic diagram illustrating a radiator unit of a radiator for terahertz electromagnetic radiation in some embodiments of the invention.

FIG. 26 shows a radiator unit 2600 of a radiator for terahertz electromagnetic radiation in some embodiments of the invention. The radiator unit 2600 can be considered as a more specific implementation of the radiator unit 2500.

The radiator unit 2600 generally includes an oscillator arrangement (with two oscillators 2602A, 2602B and a coupler 2602C), and a patch antenna arrangement 2604. The oscillator arrangement is operable to generate third harmonic power (e.g., in the form of electric current or voltage). The patch antenna arrangement 2604 is operably coupled with the oscillator arrangement for radiating terahertz electromagnetic radiation based on the third harmonic power generated by the oscillator arrangement.

In some embodiments, the oscillators 2602A, 2602B are arranged to differentially feed the patch antenna arrangement 2604.

The oscillator 2602A of the oscillator arrangement is operable to generate third harmonic power (e.g., in the form of electric current or voltage). The oscillator 2602A may include a transistor arrangement and associated circuit arrangement.

In some embodiments, the oscillator 2602A includes two transistors each having a gate terminal, a source terminal, and a drain terminal. The two transistors may each respectively be a solid-state electronic device such as a silicon-based solid-state electronic device. For example, the two transistors may each be a field effect transistor (FET). The two transistors may each respectively be arranged (e.g., controlled) to selectively operate in (e.g., transition among) an active region, a cut-off region, and a triode region for facilitating generation of third harmonic power. In some embodiments, the two transistors are operably coupled to operate in phase.

In some embodiments, the oscillator 2602A further includes two gate/drain/source circuits, one for each of the transistors (i.e., electrically connected to the corresponding gate, source, and/or drain terminal(s) of the corresponding transistor). In some embodiments, the source terminals of the two transistors are electrically connected, e.g., directly electrically connected, with each other. In some embodiments, the gate terminals of the two transistors are electrically connected, e.g., directly electrically connected, with each other. In some embodiments, the gate terminals of the two transistors are electrically connected with the coupler 2602C. In some embodiments, the gate/drain/source circuits provides: a first circuit arrangement electrically connected with the source terminal of the first transistor, a second circuit arrangement electrically connected with the source terminal of the second transistor, a third circuit arrangement electrically connected with the drain terminal of the first transistor and operably coupled with the patch antenna arrangement 2604, and a fourth circuit arrangement electrically connected with the drain terminal of the second transistor and operably coupled with the patch antenna arrangement 2604.

In some embodiments, the first circuit arrangement includes a capacitive arrangement for facilitating oscillation and a transmission line arrangement for power supply. The capacitive arrangement and the transmission line arrangement of the first circuit arrangement may be arranged electrically in parallel. In some examples, the capacitive arrangement of the first circuit arrangement is grounded. In some examples, the transmission line arrangement of the first circuit arrangement is grounded.

In some embodiments, the second circuit arrangement includes a capacitive arrangement for facilitating oscillation and a transmission line arrangement for power supply. The capacitive arrangement and the transmission line arrangement of the second circuit arrangement may be arranged electrically in parallel. In some examples, the capacitive arrangement of the first circuit arrangement is grounded. In some examples, the transmission line arrangement of the first circuit arrangement is grounded.

In some embodiments, the construction of the first circuit arrangement and the construction of the second circuit arrangement are generally identical (but connected to different source terminals of different transistors).

In some embodiments, the third circuit arrangement includes a transmission line arrangement operably coupled with the patch antenna arrangement 2604 and an AC short termination arrangement electrically connected with the transmission line arrangement. In some examples, the AC short termination arrangement of the third circuit arrangement includes a grounded capacitive arrangement electrically connected in series with the transmission line arrangement. In some examples, the transmission line arrangement of the third circuit arrangement includes: a first transmission line portion with an end electrically connected in series with the AC short termination arrangement, and a second transmission line portion extending from the first transmission line portion and electrically coupled with the patch antenna arrangement 2604 for capacitively feeding the patch antenna arrangement. The two transmission line portions may be generally perpendicular.

In some embodiments, the fourth circuit arrangement includes a transmission line arrangement operably coupled with the patch antenna arrangement 2604 and an AC short termination arrangement electrically connected with the transmission line arrangement. In some examples, the AC short termination arrangement of the fourth circuit arrangement includes a grounded capacitive arrangement electrically connected in series with the transmission line arrangement. In some examples, the transmission line arrangement of the fourth circuit arrangement includes: a first transmission line portion with an end electrically connected in series with the AC short termination arrangement, and a second transmission line portion extending from the first transmission line portion and electrically coupled with the patch antenna arrangement 2604 for capacitively feeding the patch antenna arrangement. The two transmission line portions may be generally perpendicular.

In some embodiments, the construction of the third circuit arrangement and the construction of the fourth circuit arrangement are generally identical (but connected to different drain terminals of different transistors).

The oscillator 2602B of the oscillator arrangement is operable to generate third harmonic power (e.g., in the form of electric current). The construction of the oscillator 2602B is generally identical to the construction of the oscillator 2602A. Thus, the above description related to the construction of the oscillator 2602A is application to the oscillator 2602B.

The coupler 2602C of the oscillator arrangement electrically couples the two oscillators 2602A, 2602B (hence the two oscillators 2602A, 2602B can be referred to as "coupled oscillators"). In some embodiments, the coupler 2602C includes an even-mode-shorted coupler for enabling or sustaining an out-of-phase coupling mode between the two oscillators 2602A, 2602B. In some embodiments, the even-mode-shorted coupler may include a transmission line arrangement electrically connected between the two oscillators 2602A, 2602B, and a capacitive arrangement electrically connected with the transmission line arrangement and operable to facilitate shorting of even-mode impedance.

In some embodiments, the patch antenna arrangement 2604 includes an on-chip patch antenna arrangement.

In some embodiments, the patch antenna arrangement 2604 includes multiple (e.g., two) patch elements each respectively operably coupled with the two oscillators 2602A, 2602B. In some examples, the patch elements may be generally identical in terms of shape and size and material. Optionally, the patch elements may each be part (e.g., half) of a respective larger patch. In some embodiments, one patch element is electrically coupled (e.g., capacitively coupled) with the third circuit arrangements of the two oscillators 2602A, 2602B and another patch element is electrically coupled (e.g., capacitively coupled) with the fourth circuit arrangements of the two oscillators 2602A, 2602B. In some embodiments, the first transistors of the two oscillators 2602A, 2602B are arranged to selectively or alternately provide third harmonic power to one of the patch elements, and the second transistors of the two oscillators 2602A, 2602B are arranged to selectively or alternately provide third harmonic power to the other one of the patch elements.

Figure 27:
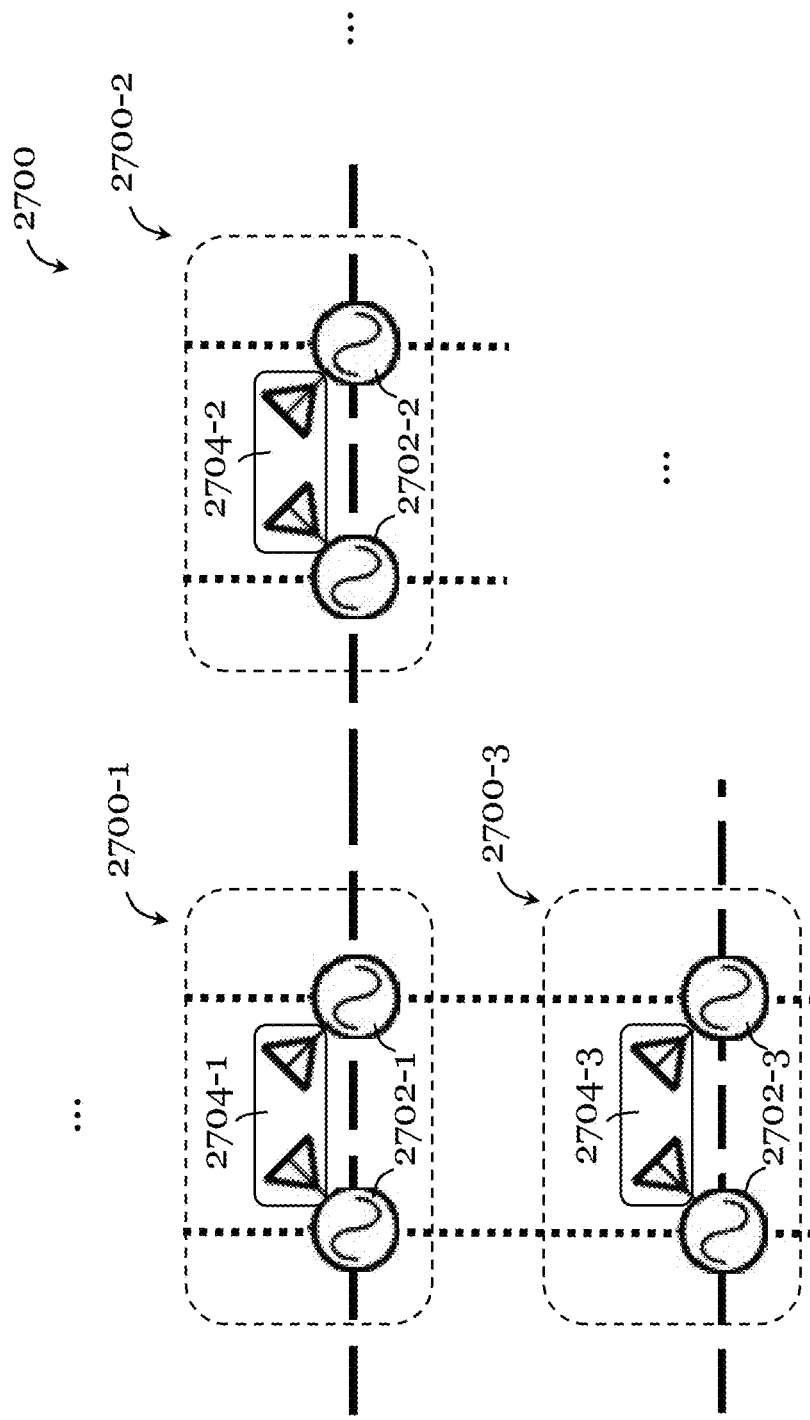
FIG. 27 is a schematic diagram illustrating a radiator for terahertz electromagnetic radiation in some embodiments of the invention.

FIG. 27 shows a radiator 2700 for terahertz electromagnetic radiation in some embodiments of the invention. The radiator 2700 includes multiple radiator units 2700-1, 2700-2, 2700-3 operably coupled with each other. While FIG. 27 only shows three radiator units 2700-1, 2700-2, 2700-3, it should be appreciated that the radiator 2700 can include any number of (at least one) radiator units.

In some embodiments, each of the radiator units 2700-1, 2700-2, 2700-3 may be the radiator unit 2500 or the radiator unit 2600. Each of the radiator units 2700-1, 2700-2, 2700-3 respectively includes an oscillator arrangement 2702-1, 2702-2, 2702-3 operable to generate third harmonic power (e.g., in the form of electric current or voltage) and a patch antenna arrangement 2704-1, 2704-2, 2704-3 operably coupled with the corresponding oscillator arrangement 2702-1, 2702-2, 2702-3 for radiating terahertz electromagnetic radiation based on the third harmonic power generated by the corresponding oscillator arrangement 2702-1, 2702-2, 2702-3. In some embodiments, the radiator units 2700-1, 2700-2, 2700-3 are operably coupled to operate coherently.

In some embodiments, the radiator 2700 may include multiple radiator units arranged in an array with one or more rows. In some embodiments, the radiator 2700 may include multiple radiator units arranged in an array with multiple rows each including at least one radiator unit, and all of the oscillators of all the radiator units form multiple rows and multiple columns of oscillators. In some embodiments, the array (of multiple radiator units) can be divided into multiple subarrays each having multiple rows, and each subarray may be subjected to a respective bias voltage, which can be controlled to affect one or more properties (e.g., radiation pattern, direction, etc.) of the terahertz electromagnetic radiation provided by the radiator 2700.

In the radiator 2700 of FIG. 27, the radiator units 2700-1, 2700-2 are arranged in the same row whereas the radiator units 2700-1, 2700-3 are arranged in adjacent rows.

The radiator units 2700-1, 2700-2 in the same row may be operably (e.g., electrically) coupled via a coupling arrangement. In some embodiments, the coupling arrangement includes an even-mode-shorted coupler for enabling or sustaining an out-of-phase coupling mode between one oscillator of the oscillator arrangement 2702-1 of the radiator unit 2700-1 and an adjacent oscillator of the oscillator arrangement 2702-2 of the radiator unit 2700-2. In some embodiments, the even-mode-shorted coupler of the coupling arrangement may include a transmission line arrangement electrically connected between one oscillator of the oscillator arrangement 2702-1 of the radiator unit 2700-1 and the adjacent oscillator of the oscillator arrangement 2702-2 of the radiator unit 2700-2, and a capacitive arrangement electrically connected with the transmission line arrangement and operable to facilitate shorting of an even-mode impedance.

The radiator units 2700-1, 2700-3 in adjacent rows may be operably (e.g., electrically) coupled via a coupling arrangement. In some embodiments, the coupling arrangement includes two couplers, one electrically connected between one oscillator of the radiator unit 2700-1 and one oscillator of the radiator unit 2700-2, and another electrically connected between another oscillator of the radiator unit 2700-1 and another oscillator of the radiator unit 2700-2. The two couplers may be odd-mode-shorted couplers each for enabling or sustaining an in-phase coupling mode between the respective two oscillators it electrically connects with. In some embodiments, the odd-mode-shorted couplers may each respectively include: a transmission line arrangement electrically connected between the corresponding oscillator of the radiator unit 2700-1 and the corresponding oscillator of the radiator unit 2700-2, one capacitive arrangement electrically connected between the transmission line arrangement and the corresponding oscillator of the radiator unit 2700-1 and operable to facilitate shorting of an odd-mode impedance, and one capacitive arrangement electrically connected between the transmission line arrangement and the oscillator of the radiator unit 2700-2 and operable to facilitate shorting of an odd-mode impedance.

In some embodiments, the radiator 2700 can be fabricated using CMOS technologies, such as 65 nm CMOS process/technology. In some embodiments, the radiator 2700 can be arranged in, or formed in, an integrated circuit (chip). In some embodiments, the radiator 2700 is a terahertz radiator configured for terahertz electromagnetic radiation only. In some embodiments, the radiator 2700 is configured for terahertz electromagnetic radiation as well as for electromagnetic radiation at one or more other frequency or frequencies.

The following disclosure provides further example embodiments of a radiator for terahertz electromagnetic radiation and a radiator unit for terahertz electromagnetic radiation of the invention. These example embodiments can be considered as more specific implementations of the designs associated with FIGS. 25 to 27.

In some embodiments, there is provided a patch-antenna-based 2D array, e.g., oscillator array or coupled oscillator array. In some embodiments, the patch-antenna-based 2D array includes a synchronization network with an operation mode that can support differential excitation of the patch antenna arrangement of the patch-antenna-based 2D array, for improved area efficiency. In some embodiments, there is provided a coupled oscillator array for high coherent radiation power and lensless effective isotropic radiated power (EIRP). In some embodiments, there is provided a high-efficiency and beam-steerable coupled oscillator-radiator array, integrated with a patch antenna arrangement for front-side radiation.

In some embodiments, there is provided a 2D synchronization network for an oscillator-and-patch-antenna-based radiator. The oscillator-and-patch-antenna-based radiator may include multiple oscillators (e.g., −gm cells) arranged in a 2D array, i.e., in multiple rows each with multiple oscillators and multiple columns each with multiple oscillators, and the 2D synchronization network may be arranged to couple the oscillators. The oscillator-and-patch-antenna-based radiator may also include a patch antenna arrangement operably coupled with the oscillators. The patch antenna arrangement may include patch antennas each differentially fed by two adjacent coupled oscillators. In some embodiments, the 2D synchronization network can sustain an out-of-phase coupling mode for adjacent coupled oscillators and an in-phase coupling mode for adjacent coupled oscillators in the same column for different columns.

In this embodiment, the 2D synchronization network that sustains an out-of-phase coupling mode for adjacent oscillators (e.g., −gm cells) in each row and an in-phase coupling mode for adjacent oscillators (e.g., −gm cells) in each column (and different rows). In combination with the differentially-fed patch antenna (which can operate as power combiner), the out-of-phase coupling mode enables constructive power combining for the oscillators (e.g., −gm cells) in each row. The in-phase coupling mode between rows enables power combining across the array.

To better understand the design, a two-element oscillator is analyzed below to determine the condition for realizing both coupling modes.

Figure 1B:
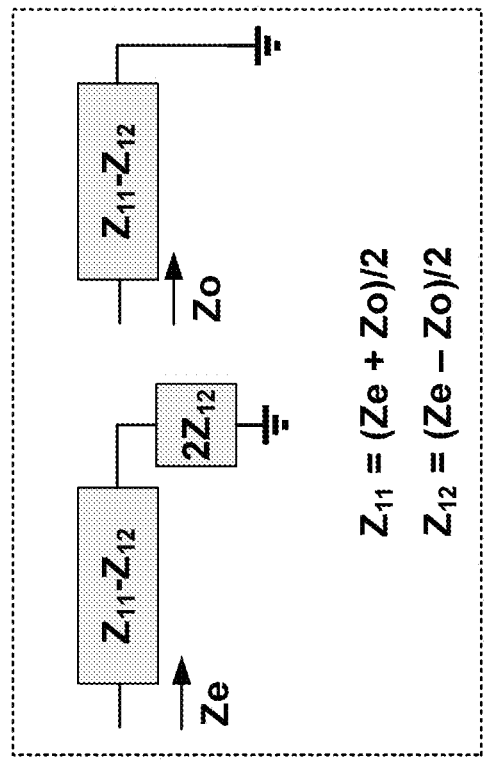
FIG. 1B is a schematic circuit diagram illustrating example even and odd mode equivalent circuits based on T-network equivalent circuit of a two-port network.
Figure 1A:
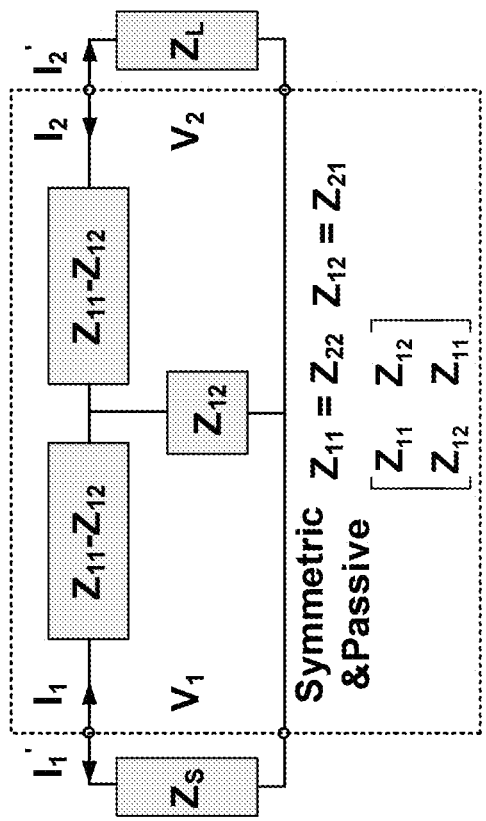
FIG. 1A is a schematic circuit diagram illustrating an example dual-core (two-element) oscillator model.

FIG. 1A shows a general two-element oscillator model in one example. In FIG. 1A, $Z_S$ and $Z_L$ represent the equivalent input impedance of the two coupled cores. It is noted that the real parts of $Z_S$ or $Z_L$ are negative so that they can replenish the energy loss in the two-port coupler between $Z_S$ and $Z_L$.

In this example, the two-port coupler is modeled using Z parameters. For a passive, symmetric two-port network ($Z_{11}=Z_{22}$, $Z_{12}=Z_{21}$), the voltages and currents relationship can be represented as follows:

$$\begin{bmatrix} V_1 \\ V_2 \end{bmatrix} = \begin{bmatrix} Z_{11} & Z_{12} \\ Z_{12} & Z_{11} \end{bmatrix} \begin{bmatrix} I_1 \\ I_2 \end{bmatrix} \quad (1)$$

For the two cores, the voltages and currents are represented as follows:

$$\begin{bmatrix} V_1 \\ V_2 \end{bmatrix} = \begin{bmatrix} Z_s & 0 \\ 0 & Z_L \end{bmatrix} \begin{bmatrix} I'_1 \\ I'_2 \end{bmatrix} \quad (2)$$

If the two cores collectively oscillate, the Kirchhoffs Current Low (KCL) should be satisfied as follows:

$$\begin{bmatrix} I_1 \\ I_2 \end{bmatrix} = -\begin{bmatrix} I'_1 \\ I'_2 \end{bmatrix} \quad (3)$$

Based on the above equations, the voltage relationship between the two ports can be represented as follows:

$$\frac{V_1}{V_2} = \frac{Z_{11}^2 - Z_{12}^2 + Z_{11}Z_L}{Z_{12}Z_L} \quad (4)$$

The relationship between $Z_S$ and $Z_L$ can also be deduced as $$Z_s = \frac{Z_{12}^2 - Z_{11}^2 - Z_{11}Z_L}{Z_{11} + Z_L} \quad (5)$$

From another perspective, the Z parameters can be rewritten using even and odd mode impedances for a symmetric two-port network. FIG. 1B shows the related even and odd mode equivalent circuits based on T-network equivalent circuit of a two-port network. Accordingly, it can be deduced that:

$$Z_{11} = \frac{Z_e + Z_o}{2} \quad (6)$$

$$Z_{12} = \frac{Z_e - Z_o}{2} \quad (7)$$

Further, equations (4) and (5) can be rewritten using even and odd mode impedances as follows:

$$\frac{V_1}{V_2} = \frac{(Z_e + Z_o)Z_L + 2Z_eZ_o}{(Z_e - Z_o)Z_L} \quad (8)$$

-continued $$Z_s = \frac{-2Z_eZ_o - (Z_e + Z_o)Z_L}{Z_e + Z_o + 2Z_L} \quad (9)$$

By shorting the even-mode impedance ($Z_e=0$), the voltage relationship of equation (8) equals −1 regardless of $Z_L$. This corresponds to the out-of-phase coupling mode. Assuming the two cores are identical, the impedance relationship in equation (9) is reduced to $Z_S=Z_L=-Z_o$. This condition can be used to determine the oscillation frequency and oscillation amplitude. Similarly, by shorting the odd-mode impedance ($Z_o=0$), $V_1/V_2=1$. This corresponds to the in-phase coupling mode. Assuming the two cores are identical, the impedance relationship in equation (9) is reduced to $Z_S=Z_L=-Z_e$.

Based on the above findings, a 2D scalable coupled oscillator array with desired operation mode can be formed.

Figure 2:
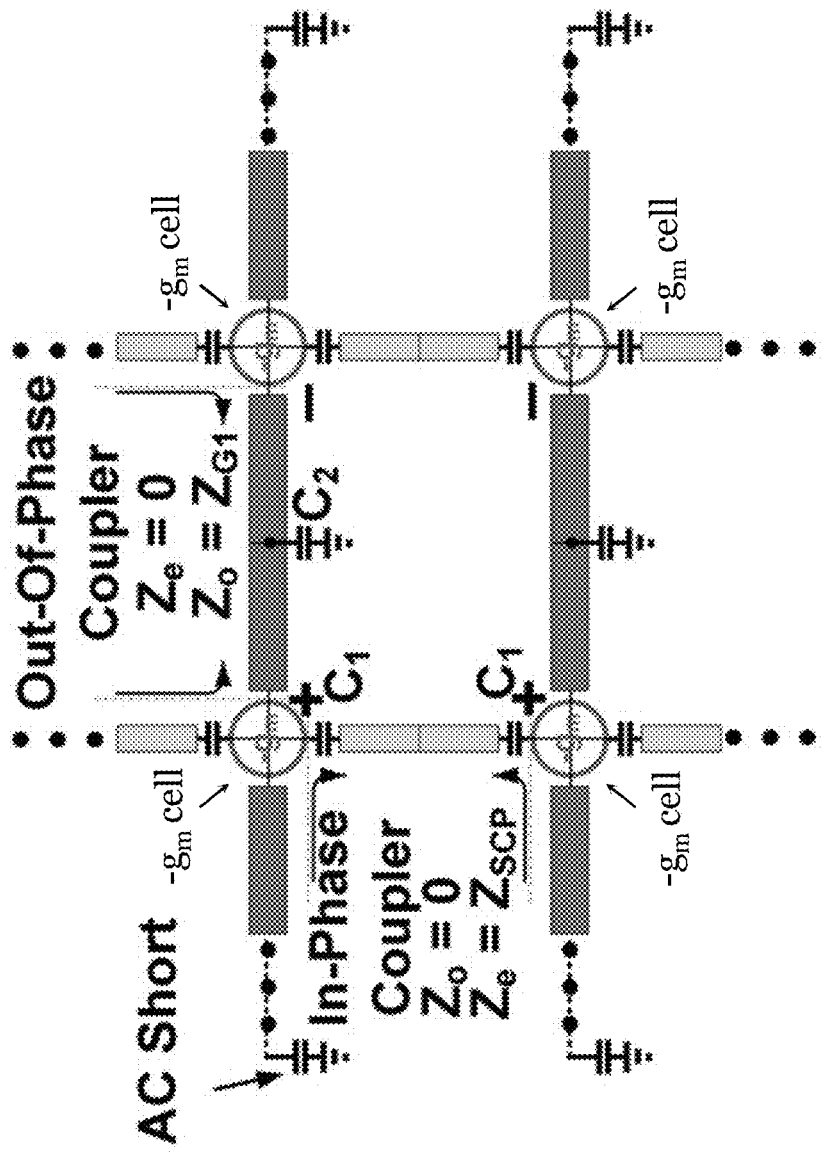
FIG. 2 is a schematic diagram illustrating a scalable coupled oscillator array topology for a radiator for terahertz electromagnetic radiation in some embodiments of the invention.

FIG. 2 shows a 2D scalable coupled oscillator array topology for a radiator for terahertz electromagnetic radiation in some embodiments of the invention. In FIG. 2, in each row, an even-mode-shorted coupler ("out-of-phase coupler") can be used to sustain the out-of-phase coupling mode between the two adjacent negative gm (−gm) cells. The even-mode-shorted coupler may include a transmission line arrangement electrically connected between the two adjacent −gm cells in the same row, and a capacitive arrangement electrically connected with the transmission line arrangement and operable to facilitate shorting of even-mode impedance. In this embodiment, the even-mode-shorted coupler includes a coupling transmission line electrically connecting two adjacent −gm cells, and a capacitor $C_2$ loaded at the center of the coupling transmission line for shorting the even-mode impedance. In each column, an odd-mode-shorted coupler ("in-phase coupler") can be used to sustain the in-phase coupling mode between the two adjacent −gm cells in the same column (and in adjacent rows). The odd-mode-shorted coupler may include a transmission line arrangement electrically connected between the two adjacent −gm cells in the same column (and in adjacent rows), a first capacitive arrangement electrically connected between the transmission line arrangement and one of the two adjacent −gm cells and operable to facilitate shorting of an odd-mode impedance, and a second capacitive arrangement electrically connected between the transmission line arrangement and another one of the two adjacent −gm cells and operable to facilitate shorting of an odd-mode impedance. In this embodiment, the odd-mode-shorted coupler includes a coupling transmission line electrically connecting two adjacent −gm cells in the same column (and in adjacent rows), one capacitor $C_1$ connected between one of the −gm cells and the coupling transmission line, and another capacitor $C_1$ connected between the other one of the −gm cells and the coupling transmission line. In some embodiments, the length of the coupling transmission line is determined, then the capacitance of $C_1$ can be tuned to short the odd-mode impedance. The odd-mode impedance of the out-of-phase couplers, the even-mode impedance of the in-phase couplers, and the input impedance of −gm cells should satisfy the deduced impedance condition for sustaining oscillation, which can be determined based on the equivalent analysis presented below.

Figure 3A:
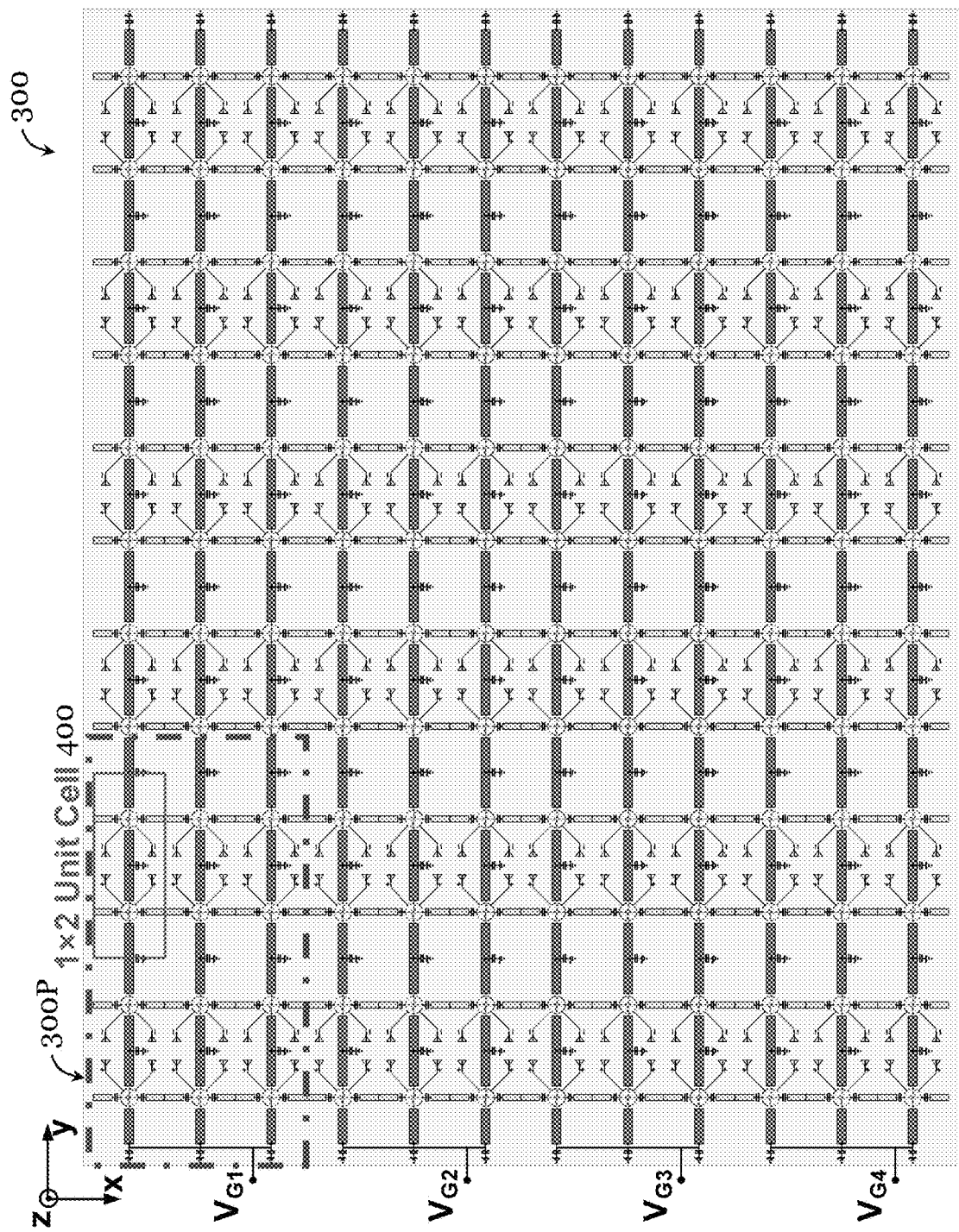
FIG. 3A is a schematic diagram illustrating a 12×12 coupled oscillator array (as a radiator for terahertz electromagnetic radiation) in one embodiment of the invention.
Figure 3B:
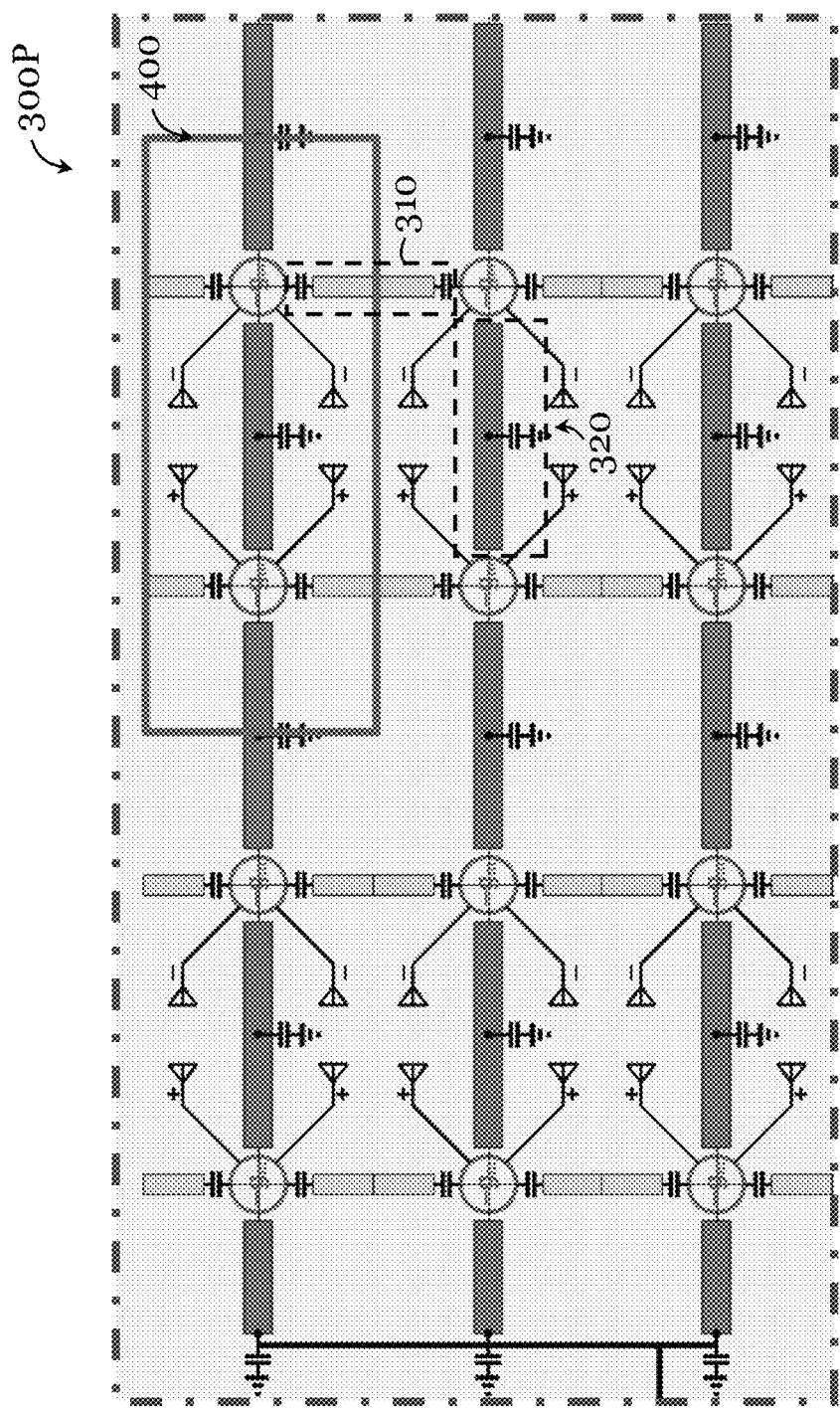
FIG. 3B is an enlarged view of part of the 12×12 coupled oscillator array in FIG. 3A.

FIGS. 3A and 3B illustrate a 12×12 coupled oscillator array 300 (as a radiator for terahertz electromagnetic radiation) in one embodiment of the invention, designed based on the 2D scalable coupled oscillator array topology illustrated in FIG. 2. A part 300P of the array 300 is shown enlarged in FIG. 3B. The 12×12 coupled oscillator array 300 includes 144 oscillators operably coupled with each other via even-mode-shorted couplers 320 and odd-mode-shorted couplers 310 (for simplicity, only one for each is labeled in FIG. 3B) as described with reference of FIG. 2.

In this embodiment, the oscillators (-gm cells) of the array 300 are arranged to collectively oscillate at the fundamental oscillation frequency ($f_0$) of 225 GHz and to radiate the third harmonic ($3f_0$) using the corresponding differentially-fed patch antennas of a patch antenna arrangement (the patches of the patch antennas are not specifically illustrated). In this embodiment, the operation mode of the third harmonic $3f_0$ is the same as the fundamental frequency $f_0$, and horizontally adjacent oscillators can provide out-of-phase excitation at $3f_0$ to the corresponding patch antenna. Accordingly, the patch antenna can serve as a power combiner to improve area efficiency.

In this embodiment, the array 300 is divided into four subarrays, each with 3 rows of 12 out-of-phase coupled oscillators (-gm cells). Each subarray is subjected to a respective bias voltage. By adjusting the bias voltages to the different subarrays, potential device mismatch in different subarrays can be compensated for broadside radiation. Also, by tuning the bias voltages, the terahertz electromagnetic radiation (e.g., beam) radiated by the array may be steered. In some embodiments, as the free-running frequency of the peripheral oscillators (-gm cells) may substantially influence the steady-state phase relationship, the radiation direction in the H-plane can be controlled by tuning the bias voltage $V_{G1}$ and/or $V_{G4}$.

Figure 4A:
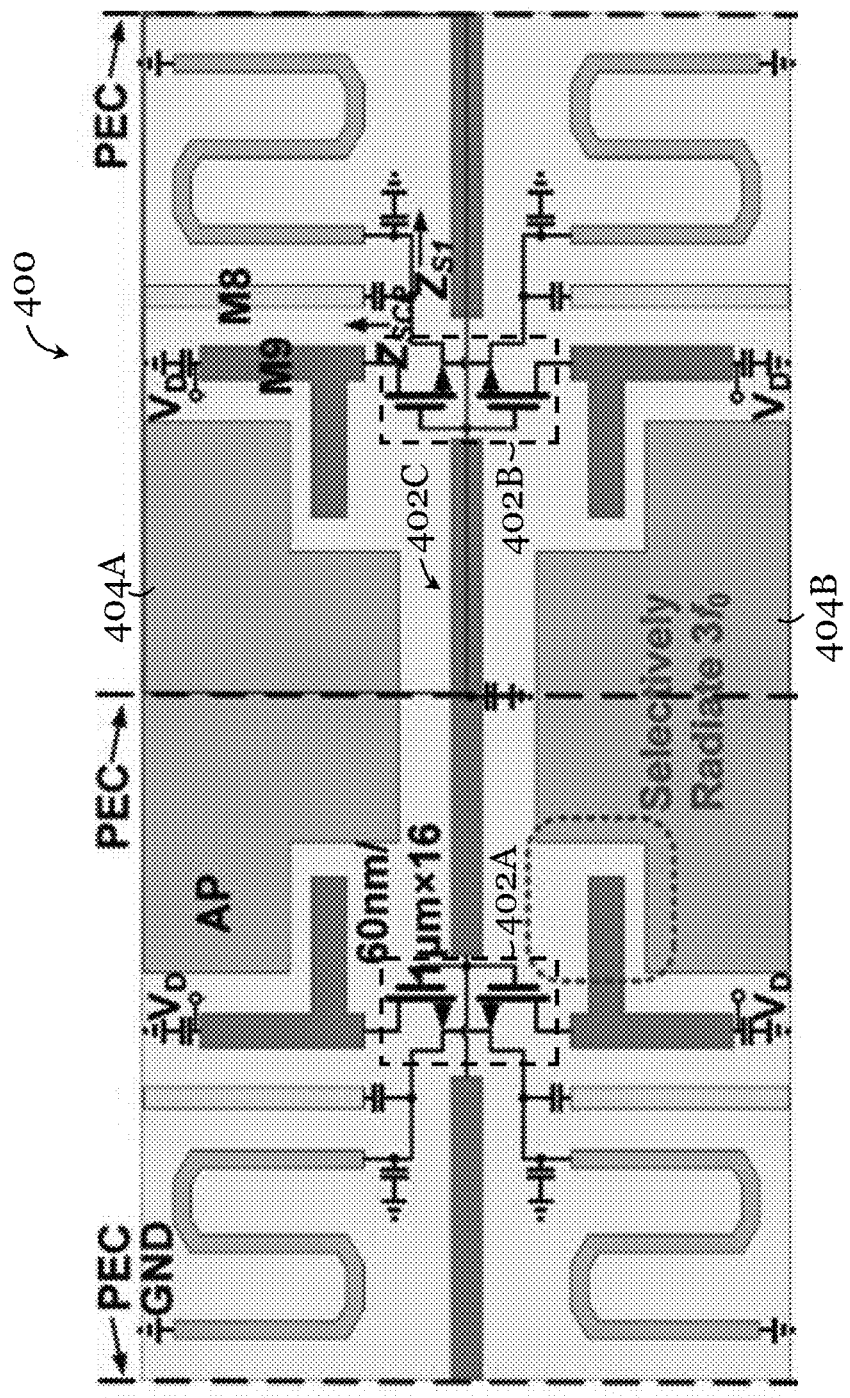
FIG. 4A is a schematic diagram illustrating the 1×2 unit cell (as a radiator unit) in the 12×12 coupled oscillator array in FIG. 3A.
Figure 4B:
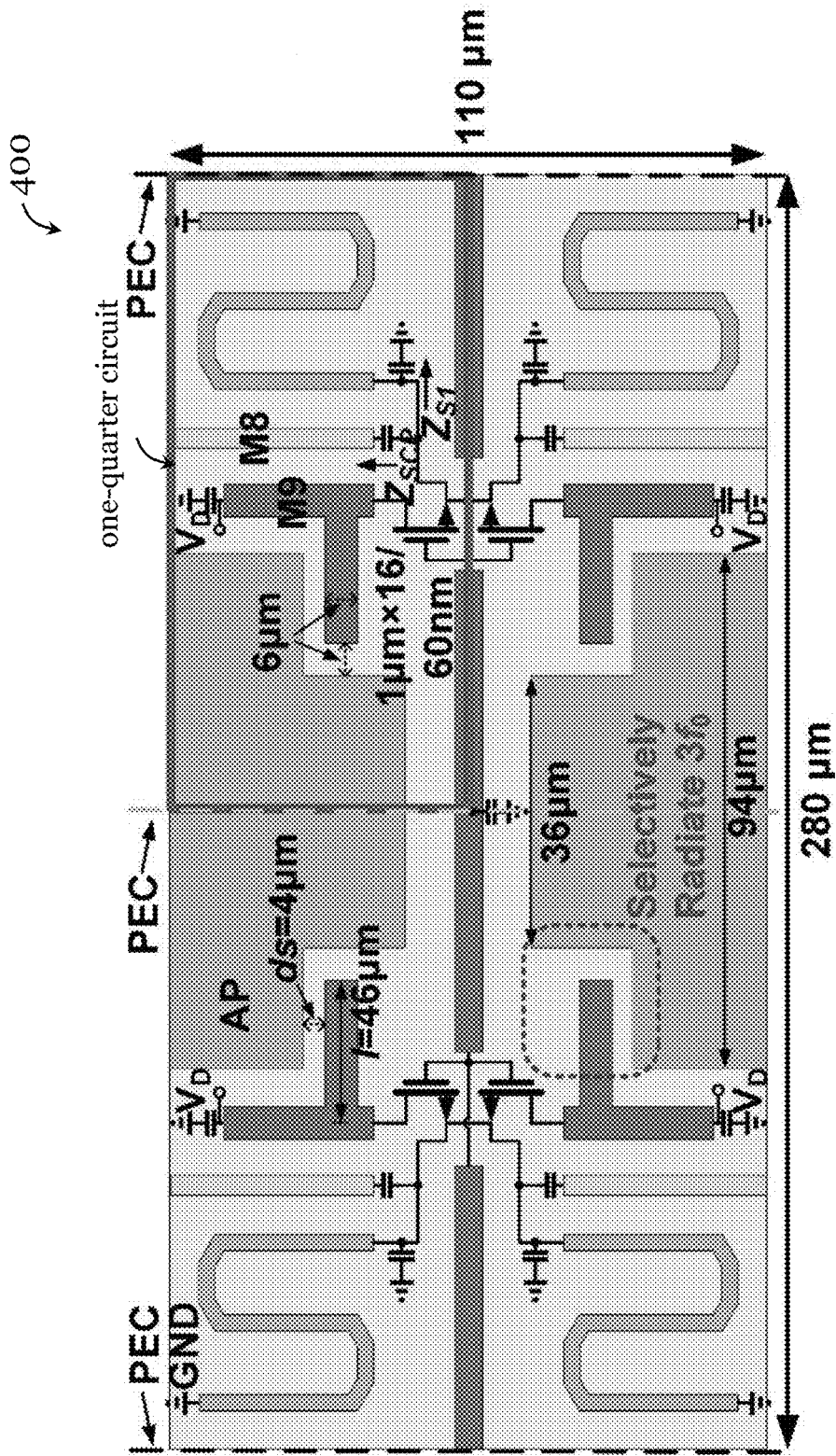
FIG. 4B is a schematic diagram illustrating the 1×2 unit cell in the 12×12 coupled oscillator array in FIG. 3A, with annotated dimensions.

FIGS. 4A and 4B illustrate a 1×2 unit cell 400 in the 12×12 coupled oscillator array 300 in FIG. 3A in one embodiment of the invention. The 1×2 unit cell may be considered as a radiator unit whereas the 12×12 coupled oscillator array (with multiple 1×2 unit cells) may be considered as a radiator (with multiple radiator units).

The unit cell 400 generally includes an oscillator arrangement operable to generate third harmonic power, and a patch antenna arrangement operably coupled with the oscillator arrangement for radiating terahertz electromagnetic radiation based on the generated third harmonic power.

In this embodiment, the unit cell 400 includes two oscillators each operable to generate third harmonic power. Each of the two oscillators respectively comprises a transistor arrangement 402A, 402B. The construction of the two oscillators are generally the same so for simplicity the following only describes the construction of the oscillator with the transistor arrangement 402A in greater detail.

In this embodiment, the transistor arrangement 402A includes two transistors (e.g., FETs), which are operably coupled to operate in phase, and each including respective drain, source, and gate terminals. The transistors may each respectively be arranged (e.g., controlled) to selectively operate in and transit between/among an active region, a cut-off region, and a triode region for facilitating generation of the third harmonic power.

In this embodiment, the gate terminals of the two transistors are electrically connected with each other directly, and the source terminals of the two transistors are electrically connected with each other directly.

In this embodiment, the two transistors of the transistor arrangement 402A are further connected with various circuit arrangements.

First, the source terminal of one of the transistors (e.g., the upper one in FIG. 4A) is electrically connected with a capacitive arrangement for facilitating oscillation and a transmission line arrangement for power supply. The transmission line arrangement is arranged electrically in parallel with the capacitive arrangement. In this embodiment, the capacitive arrangement includes a grounded capacitor and the transmission line arrangement includes a curved (wavy) transmission line with multiple turns grounded via a capacitor.

Second, the source terminal of another one of the transistors (e.g., the lower one in FIG. 4A) is electrically connected with a capacitive arrangement for facilitating oscillation and a transmission line arrangement for power supply. The transmission line arrangement is arranged electrically in parallel with the capacitive arrangement. In this embodiment, the capacitive arrangement includes a grounded capacitor and the transmission line arrangement includes a curved (wavy) transmission line with multiple turns grounded via a capacitor.

In this embodiment, the capacitive arrangement and the transmission line arrangement connected to the source terminal of one of the transistors (e.g., the upper one in FIG. 4A) are generally the same as the capacitive arrangement and the transmission line arrangement connected to the source terminal of the other one of the transistors (e.g., the lower one in FIG. 4A).

Third, the drain terminal of one of the transistors (e.g., the upper one in FIG. 4A) is electrically connected with a transmission line arrangement operably coupled with the patch antenna arrangement and an AC short termination arrangement electrically connected with the transmission line arrangement. In this embodiment, the AC short termination arrangement includes a grounded capacitor electrically connected in series with the transmission line arrangement. In this embodiment, the transmission line arrangement includes two straight transmission line portions arranged generally perpendicularly, a first one with an end electrically connected in series with the AC short termination arrangement, and a second one extending from the first and electrically coupled with the patch antenna arrangement for capacitively feeding the patch antenna arrangement. A DC supply voltage may be applied at a node between the first transmission line portion and the AC short termination arrangement.

Fourth, the drain terminal of another one of the transistors (e.g., the lower one in FIG. 4A) is electrically connected with a transmission line arrangement operably coupled with the patch antenna arrangement and an AC short termination arrangement electrically connected with the transmission line arrangement. In this embodiment, the AC short termination arrangement includes a grounded capacitor electrically connected in series with the transmission line arrangement. In this embodiment, the transmission line arrangement includes two straight transmission line portions arranged generally perpendicularly, a first one with an end electrically connected in series with the AC short termination arrangement, and a second one extending from the first and electrically coupled with the patch antenna arrangement for capacitively feeding the patch antenna arrangement. A DC supply voltage may be applied at a node between the first transmission line portion and the AC short termination arrangement.

In this embodiment, the transmission line arrangement and the AC short termination arrangement connected to the drain terminal of one of the transistors (e.g., the upper one in FIG. 4A) are generally the same as the transmission line arrangement and the AC short termination arrangement connected to the drain terminal of the other one of the transistors (e.g., the lower one in FIG. 4A).

Like the two transistors of the transistor arrangement 402A, the two transistors of the transistor arrangement 402B are also connected with various circuit arrangements. These various circuit arrangements of the two transistors of the transistor arrangement 402B are generally the same as those various circuit arrangements of the two transistors of the transistor arrangement 402A. Thu, for simplicity, they will not be described in detail.

The unit cell 400 also includes a coupler 402C electrically coupling the two oscillators. In this embodiment, the coupler 402C is an even-mode-shorted coupler (such as that described with reference to FIG. 2) for enabling or sustaining an out-of-phase coupling mode between the two oscillators. The gate terminals of the transistors of both transistor arrangements 402A, 402B of the two oscillators are all electrically connected with the even-mode-shorted coupler (and other even-mode-shorted coupler(s) connected with adjacent unit cell(s), if any).

In this embodiment, the source terminal of one of the transistors (e.g., the upper one in FIG. 4A) may be electrically connected with an odd-mode-shorted coupler (such as that described with reference to FIG. 2) for enabling or sustaining an in-phase coupling mode between itself and an adjacent oscillator in an adjacent unit cell, and/or the source terminal of another one of the transistors (e.g., the lower one in FIG. 4A) may be electrically connected with an odd-mode-shorted coupler (such as that described with reference to FIG. 2) for enabling or sustaining an in-phase coupling mode between itself and an adjacent oscillator in an adjacent unit cell.

In this embodiment, the patch antenna arrangement of the unit cell 400 includes two patch elements 404A, 404B with generally identical shape and size and construction (but arranged at different positions). Each of the patch elements 404A, 404B is respectively coupled with both oscillators. Each of the patch elements 404A, 404B may respectively be part of a larger patch (e.g., combined with the patch elements of adjacent unit cells, e.g., see FIG. 15).

In this embodiment, the patch element 404A is electrically, in particularly capacitively, coupled with the transmission line connected to the drain terminal of one of the transistors (e.g., the upper one in FIG. 4A) of the transistor arrangement 402A and with the transmission line connected to the drain terminal of one of the transistors (e.g., the upper one in FIG. 4A) of the transistor arrangement 402B. The patch element 404A may be differentially fed, i.e., the transistor arrangements 402A, 402B may selectively or alternately provide third harmonic power to the patch element 404A.

In this embodiment, the patch element 404B is electrically, in particularly capacitively, coupled with the transmission line connected to the drain terminal of another one of the transistors (e.g., the lower one in FIG. 4A) of the transistor arrangement 402A and with the transmission line connected to the drain terminal of another one of the transistors (e.g., the lower one in FIG. 4A) of the transistor arrangement 402B. The patch element 404B may be differentially fed, i.e., the transistor arrangements 402A, 402B may selectively or alternately provide third harmonic power to the patch element 404B.

As shown in FIG. 4A, in this embodiment, in plan view, the long axis of the transmission line of the coupler 402C (i.e., a horizontal axis in FIG. 4A) may be an axis of reflection symmetry for the transmission line arrangements connected to the drain and/or source terminals of one of the transistors and the transmission line arrangements connected to the drain and/or source terminals of another one of the transistors in the same transistor arrangement. In this embodiment, in plan view, the transmission line of the coupler 402C is disposed between the two patch elements 404A, 404B, with the long axis of the transmission line of the coupler 402C being an axis of reflection symmetry for the two patch elements 404A, 404B. In this embodiment, in plan view, the two oscillators are generally symmetrically disposed about an axis of reflection symmetry, which corresponds to an axis that bisects each of the two patch elements 404A, 404B (i.e., a vertical axis in FIG. 4A).

In one embodiment, the gate terminals of the transistor pairs of the transistor arrangements 402A, 402B are connected to the horizontal coupling network (of even-mode-shorted couplers, intra unit cell or inter unit cells) for out-of-phase oscillation/coupling mode. In one embodiment, the source terminals of the transistor pairs of the transistor arrangements 402A, 402B are connected to the vertical coupling network (of odd-mode-shorted couplers, inter unit cells) for in-phase oscillation/coupling mode. In one embodiment, the source terminals of the transistor pairs of the transistor arrangements 402A, 402B are separately connected to respective parallel capacitor for optimum oscillation state and respective curved transmission line for DC supply. In one embodiment, the drain terminals of the transistor pairs of the transistor arrangements 402A, 402B are separately respectively connected to transmission line with AC short termination. In one embodiment, the DC supply voltage $V_D$ for the drain terminal is fed from the AC short termination. In one embodiment, the capacitively-fed patch antenna arrangement, in particular patch elements 404A, 404B, is operably coupled with the drain terminals of the transistor pairs of the transistor arrangements 402A, 402B for selectively radiating the third harmonic power.

FIG. 4B shows illustrate some example dimensions of the unit cell 400 in one embodiment.

In this embodiment, as the transistor pair of each respective transistor arrangements 402A, 402B is connected at the same gate node and source node, the transistor pair of the transistor arrangement 402A operate in phase and the transistor pair of the transistor arrangement 402B operate in phase.

Figure 5:
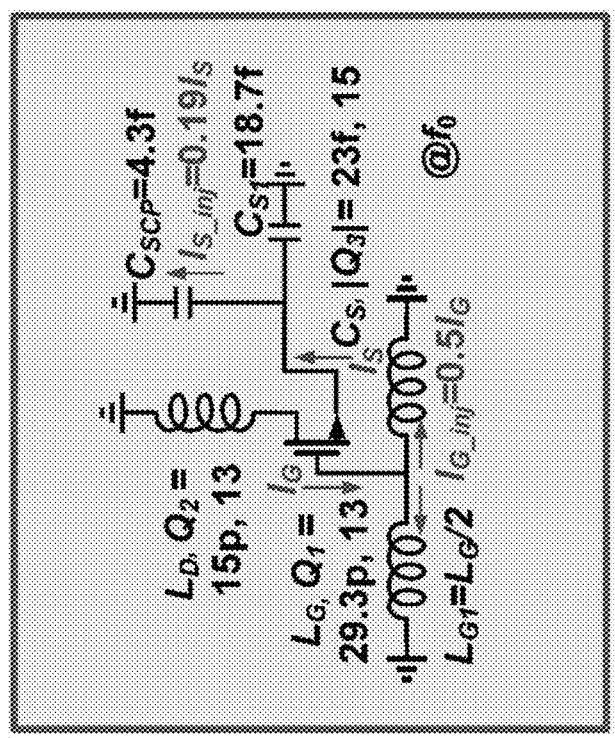
FIG. 5 is a schematic circuit diagram illustrating an equivalent AC lumped circuit at $f_0$ of a one-quarter circuit in the 1×2 unit cell in FIG. 4B.

FIG. 5 shows an equivalent AC lumped circuit at $f_0$ of a one-quarter circuit of the unit cell 400 in FIG. 4A (based on the operation mode). The equivalent AC lumped circuit in this example has a T-embedding-based oscillator topology. In this example, the coupling network can be considered as part of the oscillator. In FIG. 5, the gate inductor is separated for out-of-phase strong coupling horizontally and the source capacitor is separated for weak coupling vertically.

In some embodiments, to improve the conversion efficiency, the harmonic oscillator is purposely designed to optimize the third harmonic output power. Inventors of the present invention have realized that high-efficiency terahertz harmonic oscillator design generally includes three aspects: 1) determination of the transistor operation state to maximize the desired harmonic output current; 2) oscillator synthesis satisfying the obtained condition; and 3) proper matching at the desired harmonic.

In the following, the nonlinear operation of a transistor is studied to optimize third harmonic generation. By understanding the third harmonic current generation mechanism in a transistor, the operation conditions for a transistor to increase the third harmonic output can be determined.

Figure 6:
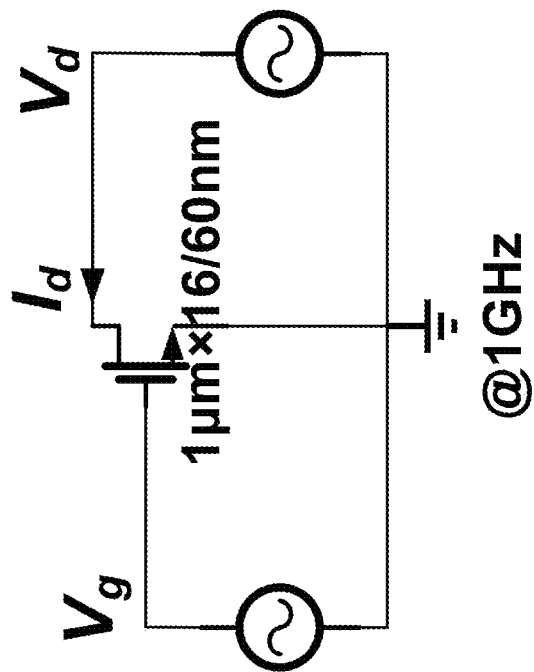
FIG. 6 is a schematic circuit diagram illustrating an example simulation setup for studying nonlinear behavior of a transistor (simulation frequency set to 1 GHz)

FIG. 6 shows an example simulation setup for studying nonlinear behavior of a transistor. In this example, the simulation frequency is set to be 1 GHz so that the parasitic effect is sufficiently small.

Compared to the nonlinearity of transconductance, the operation region transition of the transistor can output a much larger harmonic current at the transistor drain. Inventors of the present invention have devised that one of the sources of harmonic current comes from the transition between active and cut-off regions and another one of the sources of harmonic current comes from the transition between active and triode regions, and both transitions can alter the drain current waveform. Within one period, the time distribution difference between the active, cut-off, and triode regions may correspond to various operation states, which lead to variation of harmonic currents. The following disclosure focuses on the second and third harmonics because the other higher harmonics are much weaker.

The DC bias voltage and AC fundamental voltage at the transistor gate mainly determine the duration of the cut-off region. The DC supply voltage and AC fundamental signal at the transistor drain mainly determine the duration of the triode region.

FIG. 7A shows the simulated drain current waveform under the given DC bias and fundamental driving voltages as well as the gate and drain voltage waveforms. The fundamental waveforms at the gate and drain are out of phase so that the transistor can output fundamental power. Based on the setting in FIG. 7A, the transistor is already driven into the cut-off region. Then, the fundamental AC voltage $|V_{d\_f_0}|$ at the drain is changed to study its effect on the harmonic current output. FIG. 7B shows the corresponding results. Specifically, FIG. 7B shows simulated harmonic currents at the drain terminal of the transistor under different fundamental voltages at the drain terminal of the transistor, and three corresponding current waveforms at selected fundamental voltage $|V_{d\_f_0}|$.

As shown by the simulated current waveforms in FIG. 7B, the fundamental current output decreases as the $|V_{d\_f_0}|$ increases because the transistor enters the triode region. The second harmonic current first decreases to near zero and then rises under high $|V_{d\_f_0}|$. The generated second harmonic current from the active and cut-off transition is out of phase with the second harmonic current from the active and triode regions transition. Therefore, the second harmonic current output is reduced to a small or minimal value. When the transistor is driven into the deep triode region, the second harmonic current continues to increase. In this example, it can be found that the third harmonic current always increases with $|V_{d\_f_0}|$, because both transitions can contribute to third harmonic current generation.

The large harmonic current at the transistor drain can induce harmonic voltage if a resistive harmonic load is terminated for harmonic power extraction. The induced harmonic voltage can change the depth of the triode region. Therefore, the harmonic voltage at the drain can also change the harmonic current output. In one example, to study the effect of second and third harmonic voltages on the output current, the second and third harmonic voltages are respectively applied at the transistor drain with the correct phase, to ensure the transistor output second and third harmonic power to a resistive load. FIG. 8A shows simulated drain current waveforms (obtained by varying the second harmonic voltage $|V_{d\_2f_0}|$) and corresponding gate and drain voltage waveforms obtained from the transistor. FIG. 9A shows simulated drain current waveforms (obtained by varying the third harmonic voltage $|V_{d\_3f_0}|$) and corresponding gate and drain voltage waveforms obtained from the transistor.

Figure 8B:
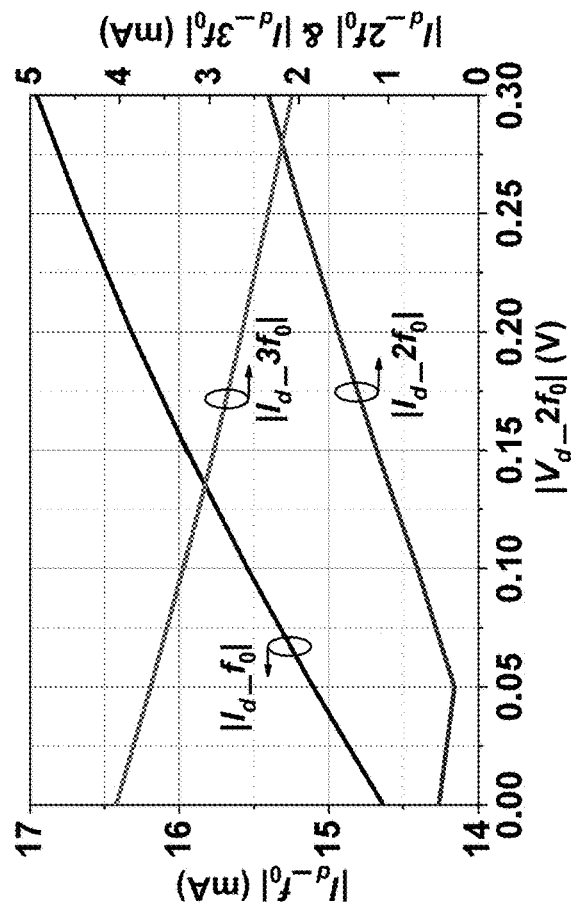
FIG. 8B is a graph showing simulated harmonic currents at the drain terminal of the transistor under different second harmonic drain voltages $|V_{d\_}2f_0|$ at the drain terminal of the transistor.
Figure 8A:
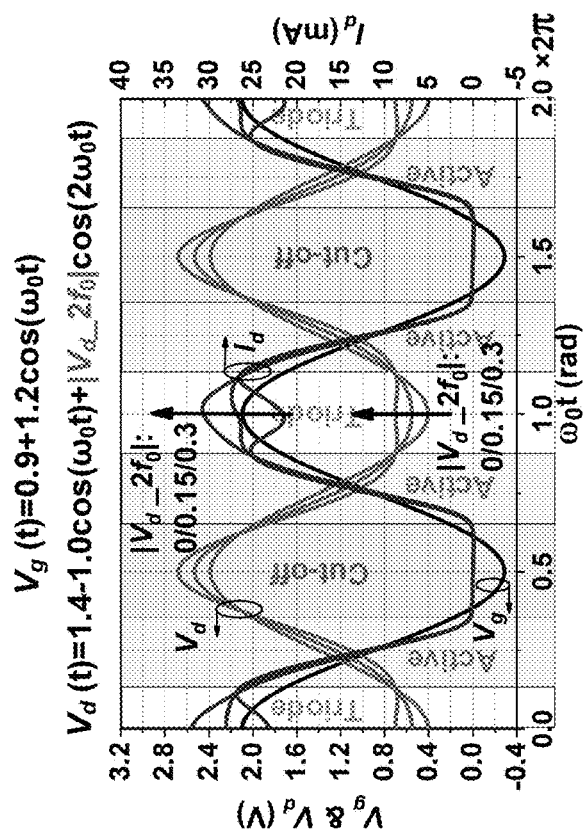
FIG. 8A is a graph showing simulated drain current waveforms (obtained by varying the second harmonic voltage $|V_{d\_2f_0}|$) and corresponding gate and drain voltage waveforms obtained from the transistor.

FIG. 8B shows simulated harmonic currents at the drain terminal of the transistor under different second harmonic drain voltages $|V_{d\_2f_0}|$ at the drain terminal of the transistor. In FIG. 8B, the harmonic current output is plotted against different second harmonic voltage amplitudes $|V_{d\_2f_0}|$. It is found that the fundamental current increases as $|V_{d\_2f_0}|$ increases. This can be understood from FIG. 8A. The current waveform recovers from the dip as $|V_{d\_2f_0}|$ increases because the transistor leaves the deep triode region. As the duration of the triode region decreases, the third harmonic current decreases, as shown in FIG. 8B. As for the second harmonic current, it first decreases to a small or minimal value and then increases with $|V_{d\_2f_0}|$. This behavior can be understood because the transistor is already in the cut-off region. The second harmonic current cancelation from active-triode transition is reduced once the triode duration is decreased. FIG. 9B shows simulated harmonic currents at the drain terminal of the transistor under different third harmonic drain voltages $|V_{d\_3f_0}|$ at the drain terminal of the transistor. The harmonic current behaviors shown in FIG. 9B are similar by increasing the amplitude of $|V_{d\_3f_0}|$ because it also reduces the triode region duration and recover the current waveform, as shown in FIG. 9A.

Based on the above, the harmonic positive feedback phenomenon in a second harmonic oscillator for boosting harmonic output can be appreciated and such phenomenon is also valid for third harmonic oscillator. By providing the transistor drain a resistive load at $3f_0$, the induced third harmonic voltage $V_{d\_3f_0}$ can improve the $|I_{d\_f_0}|$ as shown in FIG. 9B, which can boost the fundamental oscillator amplitude. The improved $|V_{d\_f_0}|$ can then increase $|I_{d\_3f_0}|$ as shown in FIG. 7B, leading to a positive feedback loop for boosting the third harmonic output power. The loop can finally remain stable under a high $|V_{d\_3f_0}|$ because $|I_{d\_3f_0}|$ decreases as $|V_{d\_3f_0}|$ increases, as shown in FIG. 9B.

In addition, from FIG. 8B, it is found that if the second harmonic voltage is induced with the proper phase at the drain, the third harmonic current will be decreased and lead to the third harmonic output power drop. To relieve this effect, the second harmonic current generation can be reduced by simultaneously driving the transistor into cut-off and triode transition, as shown in FIG. 7B. Shorting the second harmonic or providing reactive loading at $2f_0$ to shift the phase of induced voltage can also relieve $3f_0$ current reduction.

In summary, large fundamental driving voltages at the transistor gate and drain can improve the third harmonic current generation. Proper resistive loading of the transistor drain at the third harmonic is useful to boost the third harmonic output and extract the harmonic power. Moreover, minimizing second harmonic current can avoid third harmonic current output reduction.

In the above, the nonlinear operation of a transistor at low frequency is studied and methods for improving the third harmonic current generation is presented. The following now describes the design of the oscillator at a high fundamental frequency of 225 GHz, considering the parasitic capacitance of transistor.

As mentioned above, both high fundamental amplitude harmonic at the transistor gate by driving the transistor into the cut-off region and high fundamental amplitude at the transistor drain by driving the transistor into the triode region can simultaneously boost third harmonic current output. A higher net fundamental output power of the transistor can sustain a stronger oscillation fundamental amplitude in an oscillator. In some examples, the phase difference of fundamental voltage gain between the gate and drain deviates from 180° to compensate for the direct current feedthrough to improve the fundamental oscillation amplitude at a high fundamental oscillation frequency.

Figure 10:
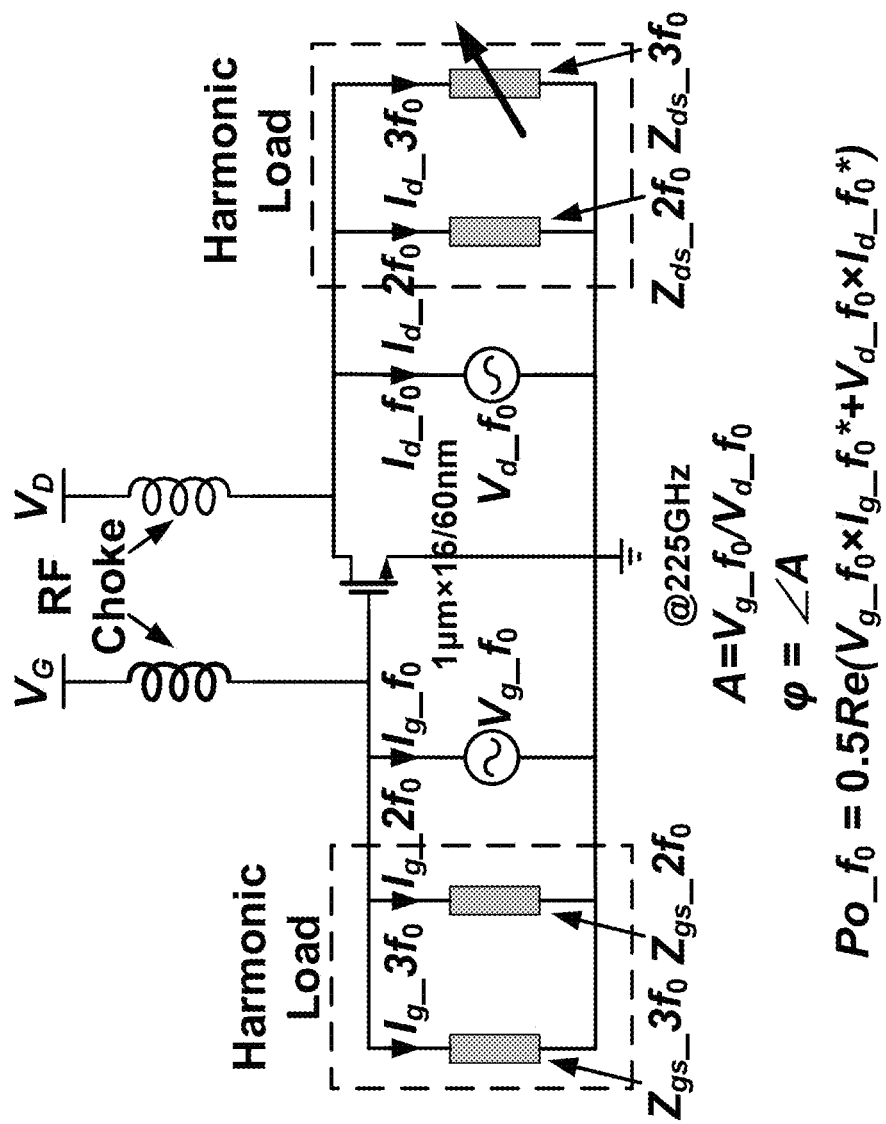
FIG. 10 is a schematic circuit diagram illustrating an example simulation setup for determining fundamental operation condition and harmonic load impedance (fundamental frequency set to 225 GHz)

FIG. 10 shows an example simulation setup for determining fundamental operation condition and harmonic load impedance (fundamental frequency set to 225 GHz). Specifically, the simulation setup in FIG. 10 can be used to determine the optimum fundamental voltage gain phase difference and corresponding net fundamental output power $Po\_f_0$.

Figure 11B:
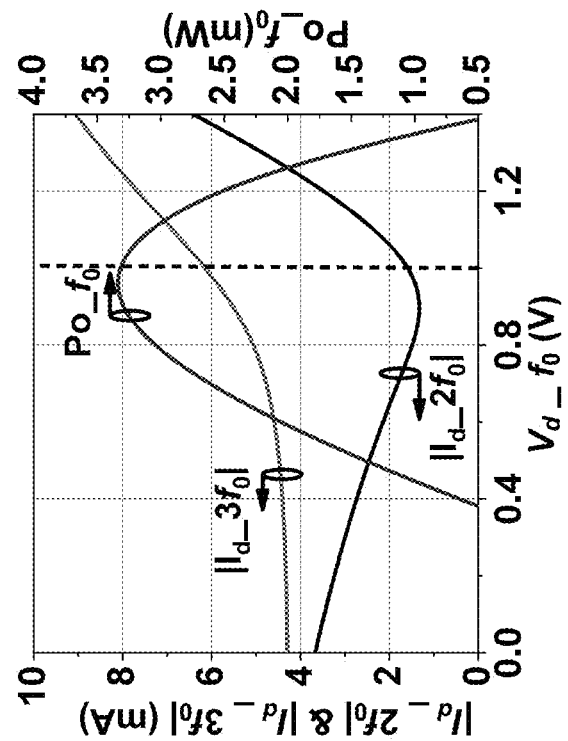
FIG. 11B is a graph showing simulated generated second and third harmonic currents and net fundamental output power from the transistor for different fundamental voltages $|V_{d\_}f_0|$ at the drain terminal of the transistor.
Figure 11A:
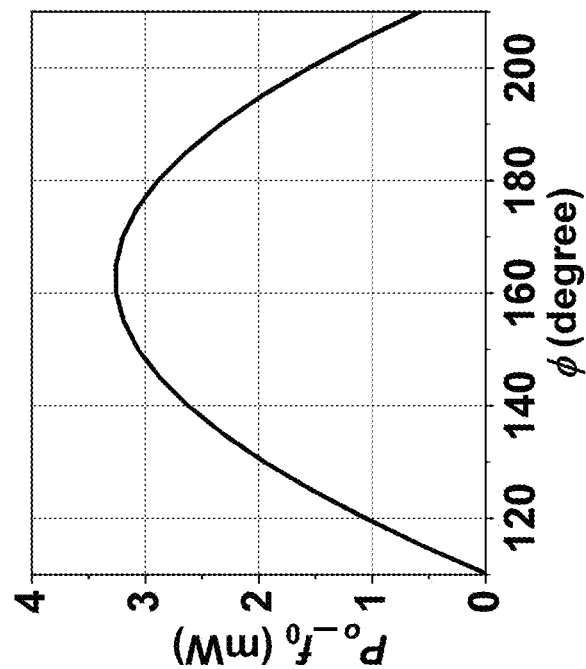
FIG. 11A is a graph showing simulated net fundamental output power Po_$f_0$ for different fundamental voltage gain phase differences p.

FIG. 11A shows simulated net fundamental output power $Po\_f_0$ for different fundamental voltage gain phase differences $\phi$. As shown in FIG. 11A, in this example, a phase difference of about 160° can maximize $Po\_f_0$ for a higher fundamental oscillation amplitude.

In one example, driving the transistor into cut-off and triode region can cancel the second harmonic current, relieving the potential adverse effect of the second harmonic voltage induced at the drain yet without shortening it, simplifying circuit design.

In one example, the gate bias voltage $V_G$ is chosen as 0.9 V, and the fundamental voltage $Vg\_f_0$ applied to the gate is 1.2 V, which drives the transistor into the cut-off region. Then, the supply voltage $V_D$ is chosen to be 1.4 V, and the fundamental voltage is swept at the drain ($V_{d\_}f_0$) using the example simulation setup in FIG. 10.

The generated second and third harmonic currents and the net fundamental output power from the transistor are shown in FIG. 11B. Specifically, FIG. 11B shows simulated generated second and third harmonic currents and net fundamental output power from the transistor for different fundamental voltages $|V_{d\_}f_0|$ at the drain terminal of the transistor.

It is found that, in this example, by making $V_{d\_}f_0=1.0$ V, the transistor can also be driven into the triode region to cancel the second harmonic current close to the minimal value. Coincidently, the $Po\_f_0$ is near the peak under $V_{d\_}f_0=1.0$ V. Based on the determined fundamental driving voltages, the corresponding currents can be obtained using the same simulation setup. Given an oscillator topology, the corresponding component values can be explicitly synthesized based on the obtained voltages and currents. The T-embedding network-based oscillator topology can be used for terahertz harmonic oscillator design. In one example, the calculated component values are labeled on the equivalent AC lumped circuit, as shown in FIG. 5.

Figure 12:
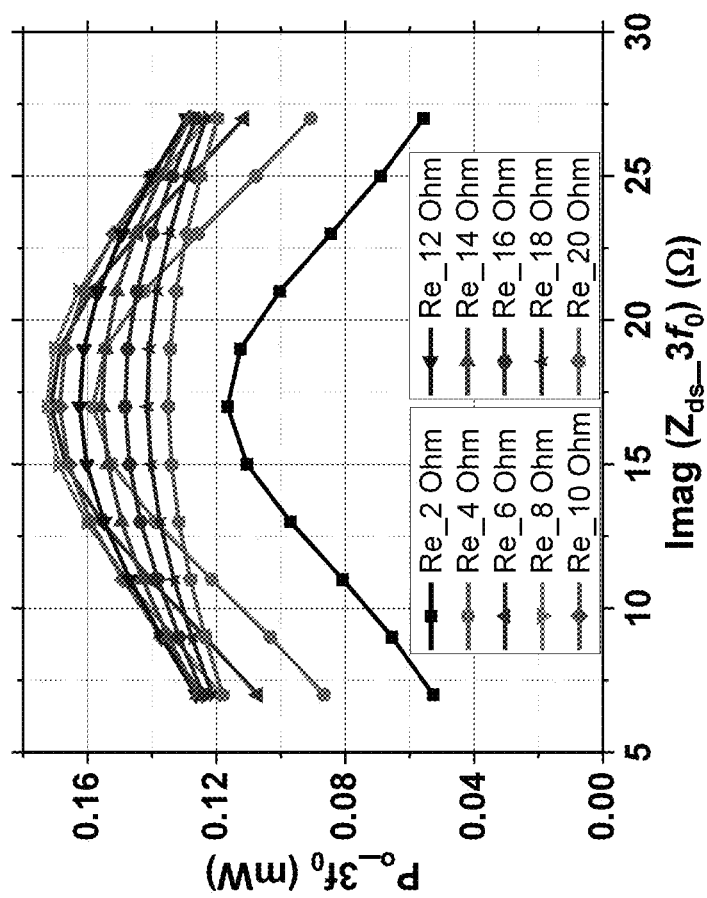
FIG. 12 is a graph showing third harmonic output power Po_$3f_0$ from the transistor under different third harmonic drain-source impedance $Z_{ds\_}3f_0$ at $3f_0$.

At low frequency, providing the transistor drain with a proper resistive load at $3f_0$ can extract third harmonic power from the transistor. As explained, this also induces a harmonic voltage with the correct phase, which can boost the output power due to harmonic positive feedback phenomenon of a harmonic oscillator. At THz frequency/frequencies, the optimum drain-source impedance at $3f_0$ should be reactive to resonate with the parasitic capacitance of the transistor to provide a resistive load. Thus, good impedance matching at $3f_0$ is particular useful, as it can effectively extract the harmonic power as well as boost the output. In one example, the optimum impedance can be determined using the setup in FIG. 10 by performing a harmonic load pull simulation. Under the determined bias and fundamental voltages, the third harmonic drain-source impedance $Z_{ds\_}3f_0$ is swept. The corresponding output power is shown in FIG. 12, which shows third harmonic output power $Po\_3f_0$ from the transistor under different third harmonic drain-source impedance $Z_{ds\_}3f_0$ at $3f_0$. In this example, the optimum $Z_{ds\_}3f_0$ is about $8+j17\Omega$ for peak third harmonic output power $Po\_3f_0$. Other harmonic impedances shown in FIG. 10 are set to zero for initial optimum $Z_{d\_}3f_0$ determination and are finally set based on the actual values of the implemented design.

In relation to topology preference for $3f_0$ extraction, in some embodiments, the synthesized T-embedding network oscillator topology is used as it naturally separates the gate and drain bias voltages, which can be easily tuned for optimum fundamental oscillation condition to boost the third harmonic output. Moreover, this topology is suitable for high-efficiency third harmonic extraction. In some embodiments of the topology, there is no explicit path to guide the third harmonic current to the lossy gate, as shown in FIG. 5, thus can reduce the harmonic current feedback loss in a simple way.

In some examples, however, an implicit third harmonic current feedback to the gate through the parasitic gate-drain or gate-source capacitor may still exist.

Figure 13:
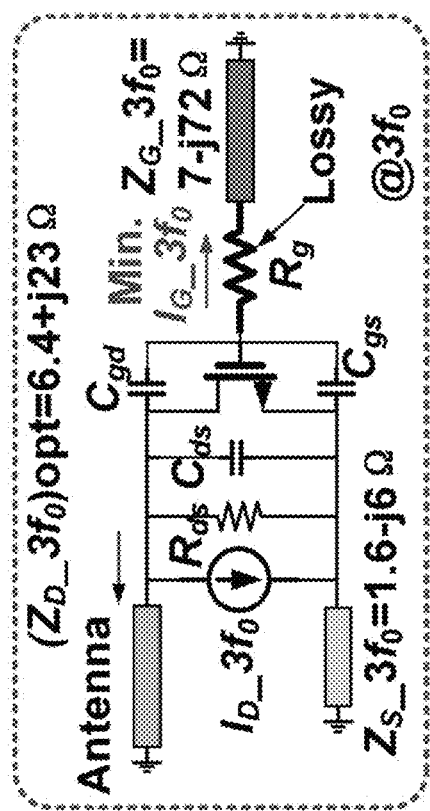
FIG. 13 is a schematic circuit diagram illustrating an equivalent AC lumped circuit at $3f_0$ of a one-quarter circuit in the 1×2 unit cell in FIG. 4B.

FIG. 13 shows an equivalent AC lumped circuit at $3f_0$ of a one-quarter circuit in the 1×2 unit cell in FIG. 4B. As shown in FIG. 13, the third harmonic current generated within the transistor is modeled as a current source. If the impedance of the source termination at $3f_0$ is small, the $3f_0$ current can directly flow to the ground rather than going back to the gate lossy resistor $R_g$ through $C_{gs}$. On the other hand, if the impedance of the gate termination at $3f_0$ is large enough, the $3f_0$ current flowing to $R_g$ through $C_{gd}$ can also be reduced. In one embodiment of the topology, the source termination is connected to a capacitor, which naturally has a low impedance at $3f_0$, as shown in FIG. 13. The gate termination at $3f_0$ has a relatively large equivalent impedance. The simulated power loss at $3f_0$ in the lossy gate resistor is about 1 µW, which is much lower than the power delivered to the antenna (about 140 µW) close to the peak value in FIG. 12.

As mentioned, good impedance matching is useful for delivering high power to the antenna effectively. Based on the obtained optimum $Z_{ds\_}3f_0$ in the above disclosure, the impedance of the antenna should be tuned to about $6.4+j23\Omega$ after de-embedding the $Zs\_3f_0$ shown in FIG. 13.

In one embodiment, a capacitive coupling antenna feeding method as shown in FIGS. 4A and 4B are used. The desired input impedance can be easily obtained by tuning 1 and ds of the transmission line portion shown in FIG. 4B.

Figures 14A, 14B:
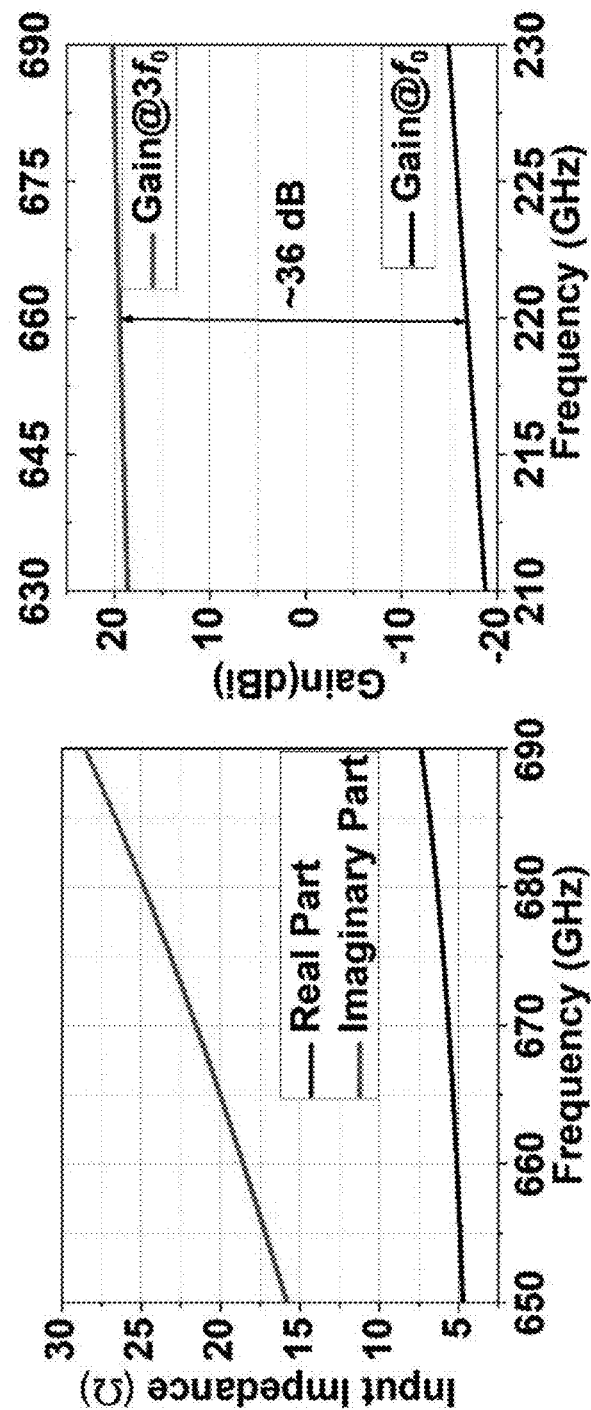
FIG. 14A is a graph showing simulated input impedance of a patch antenna in the unit cell of FIG. 4A at $3f_0$.
FIG. 14B is a graph showing simulated gain of a patch antenna in the unit cell of FIG. 4A at $f_0$ and $3f_0$.

FIG. 14A shows the final designed input impedance, i.e., simulated input impedance of a patch antenna in the unit cell 400 of FIG. 4A at $3f_0$. FIG. 14B shows simulated gain of a patch antenna in the unit cell 400 of FIG. 4A at $f_0$ and $3f_0$. As shown in FIG. 14A, the small coupling capacitance can be used to suppress fundamental radiation, evidenced by the difference in the simulated gain of the array. In one example design, a significant gain difference of about 36 dB can be realized.

A 12×12 coupled oscillator array and a 1×2 unit cell are designed based on the above embodiments (in particular FIGS. 2-4B) and fabricated using a 65-nm CMOS process.

Figure 15:
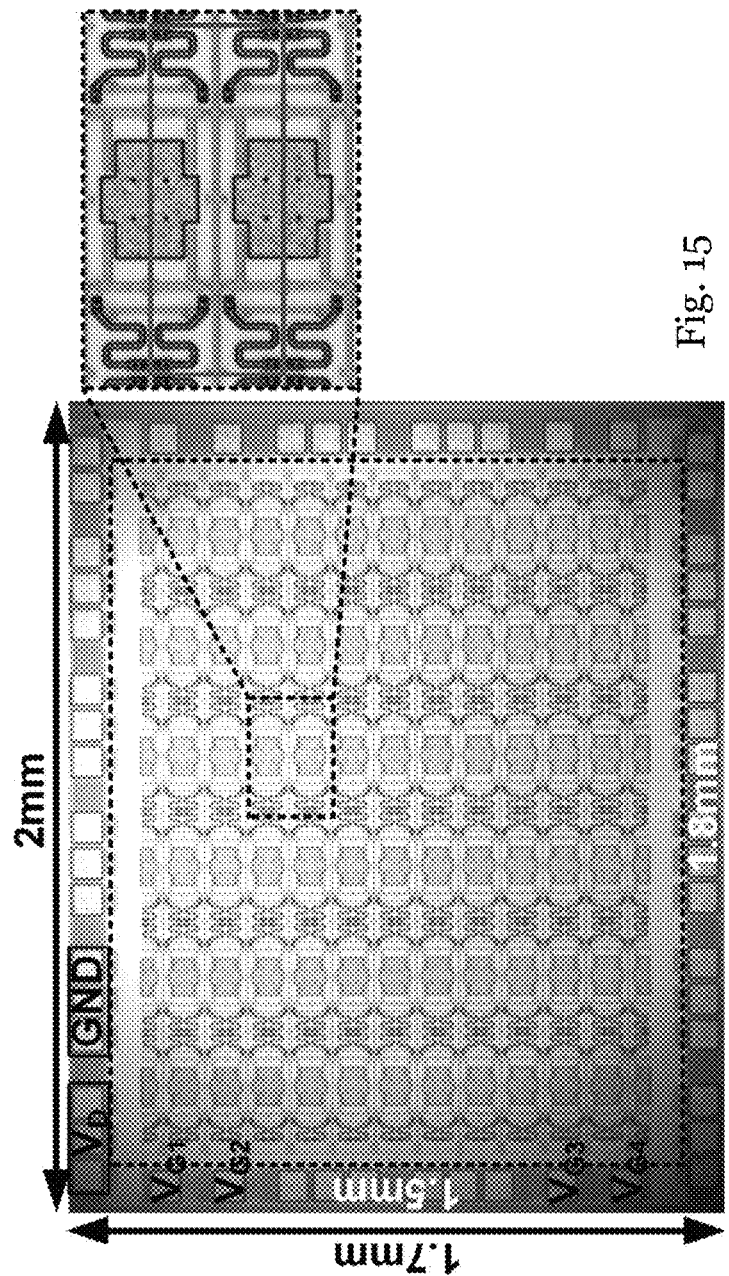
FIG. 15 is a photograph illustrating a die micrograph of an integrated circuit (chip) of a 12×12 coupled oscillator array fabricated in accordance with the 12×12 coupled oscillator array of FIG. 3A.
Figure 16:
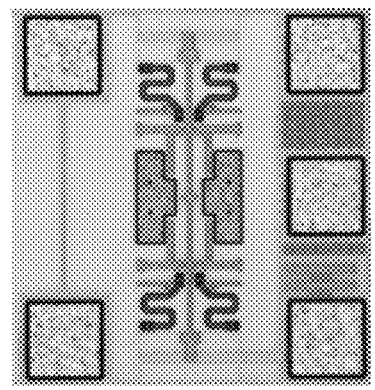
FIG. 16 is a photograph illustrating a die micrograph of an integrated circuit (chip) of a 1×2 unit cell (of a coupled oscillator array) fabricated in accordance with the 1×2 unit cell of FIG. 4A.

FIG. 15 shows a die micrograph of an integrated circuit (chip) of a 12×12 coupled oscillator array fabricated in accordance with the 12×12 coupled oscillator array of FIG. 3A. FIG. 16 shows a die micrograph of an integrated circuit (chip) of a 1×2 unit cell (of a coupled oscillator array) fabricated in accordance with the 1×2 unit cell of FIG. 4A. In this example, the whole chip size of the 12×12 coupled oscillator array is 2 mm×1.7 mm, and the core area is 1.8 mm×1.5 mm.

Figure 17:
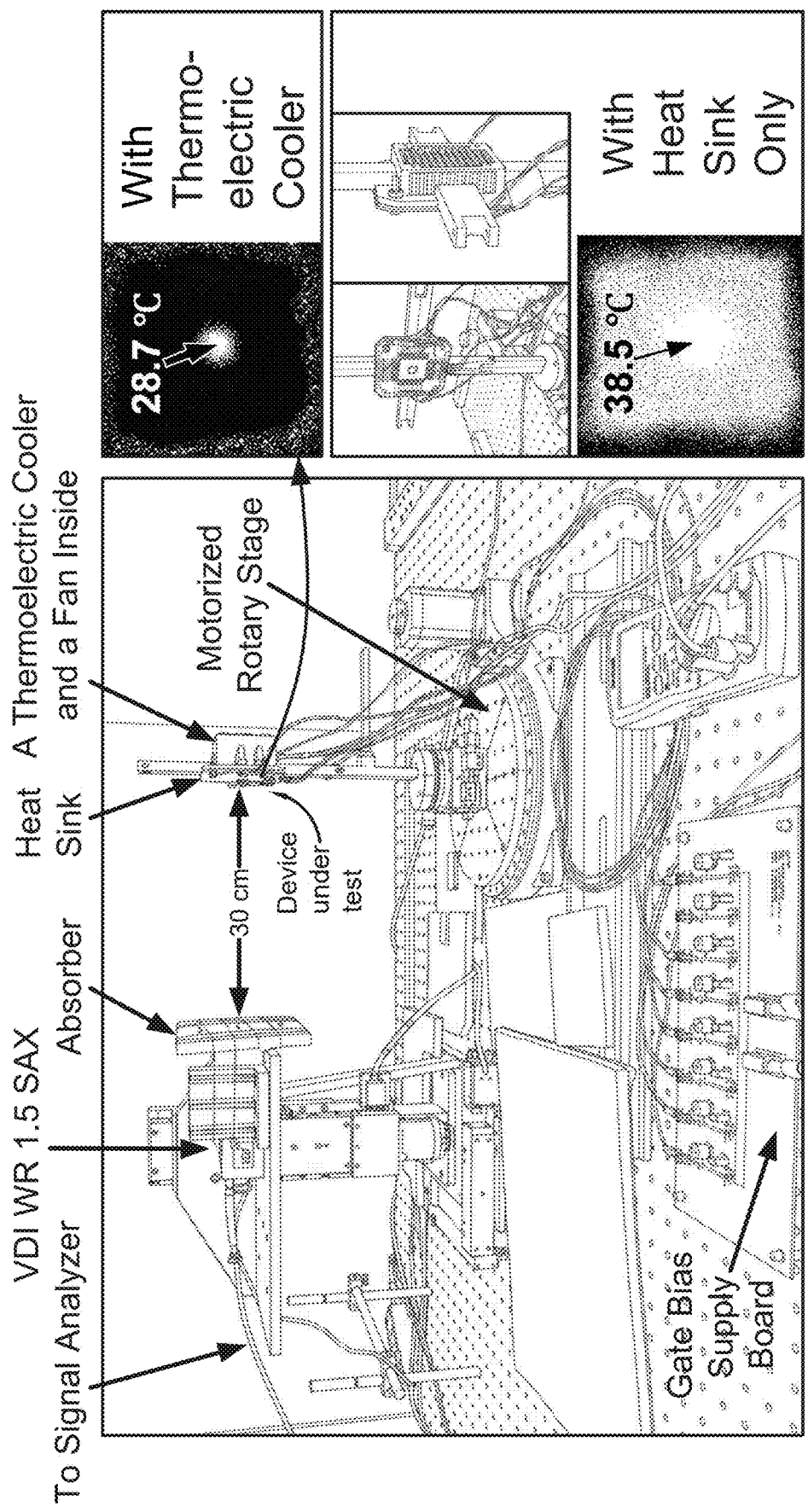
FIG. 17 is a photograph illustrating an example measurement setup for measuring frequency, radiation pattern, and effective isotropic radiated power (EIRP) of a device.

FIG. 17 shows an example measurement setup for measuring frequency, radiation pattern, and effective isotropic radiated power (EIRP) of the fabricated chip (of the array and the unit cell). In the example measurement setup of FIG. 17, a VDI WR1.5 SAX mixer (Virginia Diodes Inc.) connected to the Keysight signal analyzer N9041B (Keysight Technologies, Inc.) is used to detect the radiation signal of the chip (of the 12×12 coupled oscillator array) received by the VDI WR1.5 diagonal horn antenna (Virginia Diodes Inc.). As shown in FIG. 17, an absorber is used to cover the front metal panel of the mixer to avoid multiple reflections.

Figure 19A:
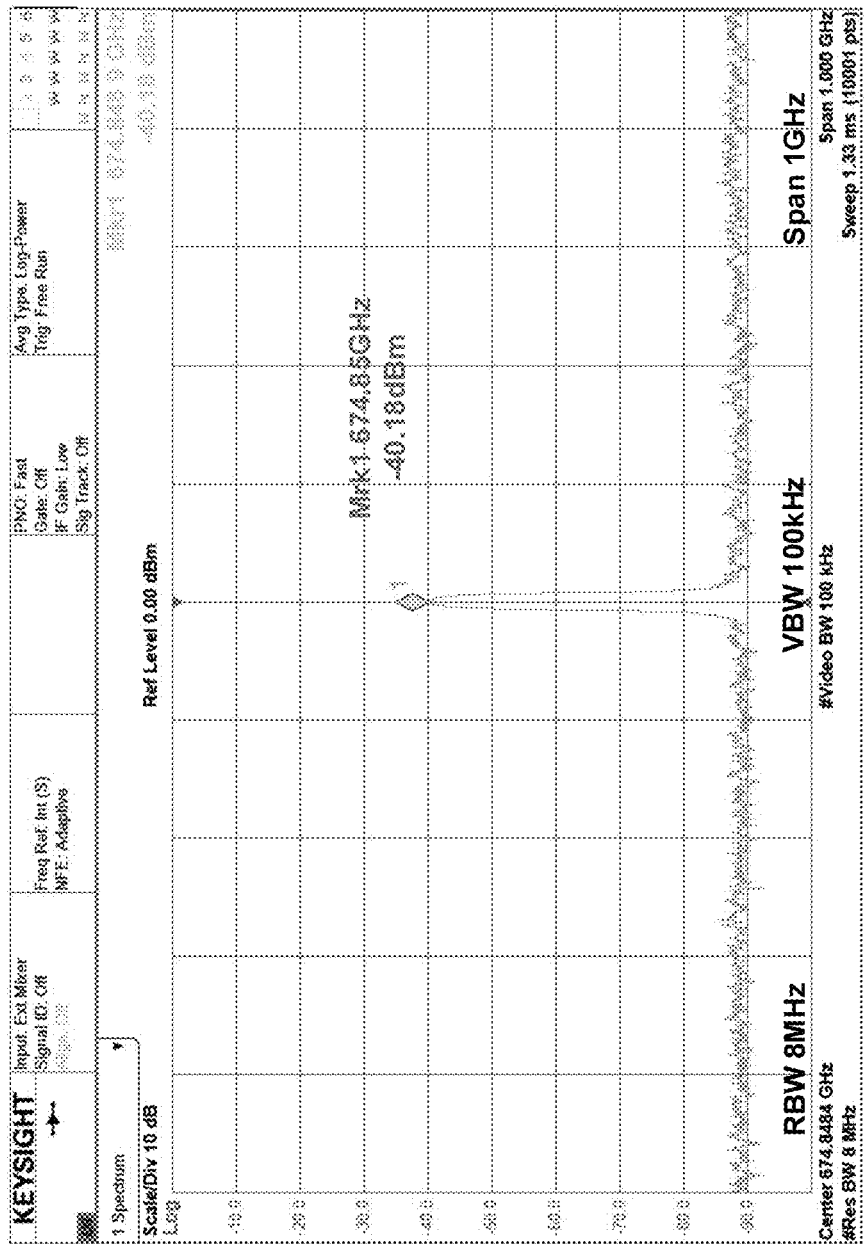
FIG. 19A is a graph showing a measured spectrum of the 12×12 coupled oscillator array of FIG. 15.
Figure 19B:
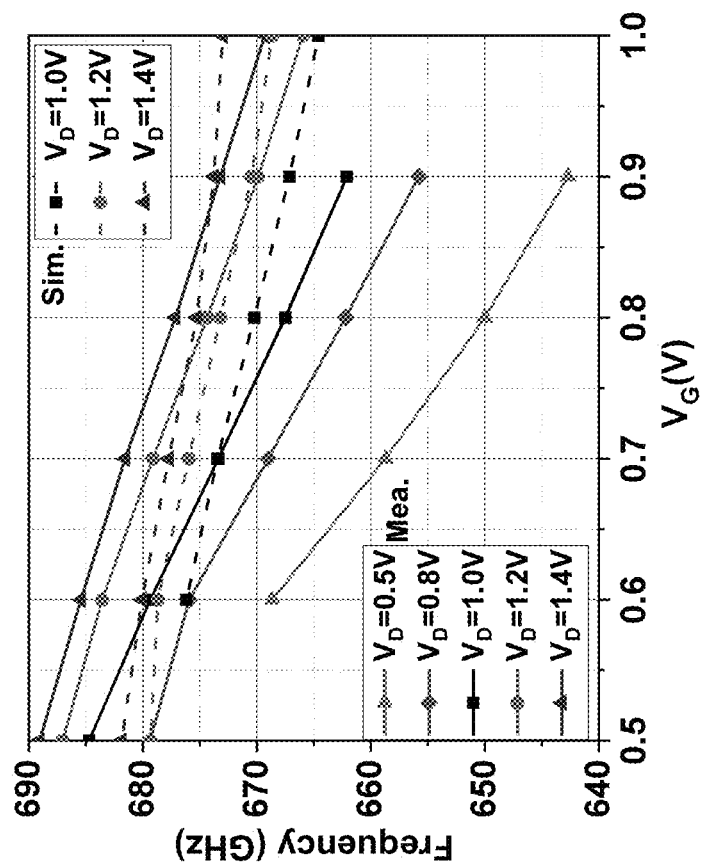
FIG. 19B is a graph showing simulated and measured frequency tuning range associated with the 12×12 coupled oscillator array of FIG. 15.

FIG. 19A shows the measured spectrum of the chip of the 12×12 coupled oscillator array at 674.85 GHz. The output frequencies can be tuned by changing the supply and bias voltages. FIG. 19B shows simulated and measured frequency tuning range associated with the 12×12 coupled oscillator array of FIG. 15. As shown in FIG. 19B, a 6.9% tuning range exists from 643 GHz to 689 GHz. It is noted the bias voltage shown in FIG. 19B is for one subarray of the array, and the bias voltages for other subarrays are slightly tuned to ensure that the radiated terahertz electromagnetic radiation beam is in the broadside direction.

Figure 18:
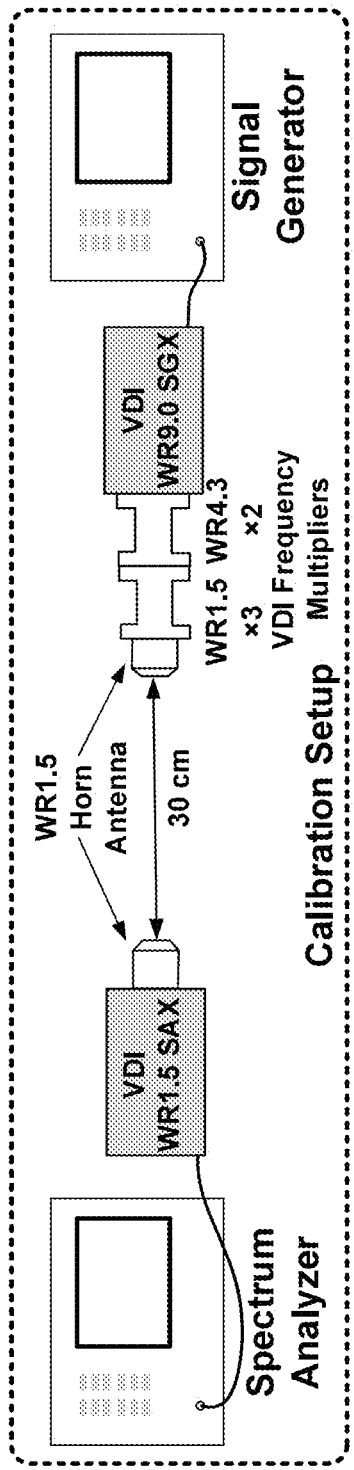
FIG. 18 is a schematic diagram illustrating an example calibration setup for calibrating path loss, conversion loss of a mixer, and cable loss.

The EIRP and radiated power are also measured with the beam tuned for broadside radiation. In the measurement, the distance between the chip of the 12×12 coupled oscillator array and horn antenna is about 30 cm, satisfying the far-field condition. The path loss, conversion loss of the mixer, and cable loss are calibrated using the example calibration setup in FIG. 18. With the calibrated data and measured power from the spectrum analyzer, the EIRP of the chip is calculated and shown in FIG. 20, which shows simulated and measured effective isotropic radiated power (EIRP) of the chip of the 12×12 coupled oscillator array of FIG. 15.

In this embodiment, the chip of the 12×12 coupled oscillator array radiates from the front side using the patch antenna arrangement. Thus, the chip can be thermally coupled with a thermal management device on another side (e.g., the back side) for regulating the temperature of the chip. In this example, the chip is directly attached to a heat sink for heat dissipation. In this example, a thermoelectric cooler and a fan are further used to transfer the heat more effectively from the chip to lower the operation temperature, as shown in FIG. 17.

Figure 20:
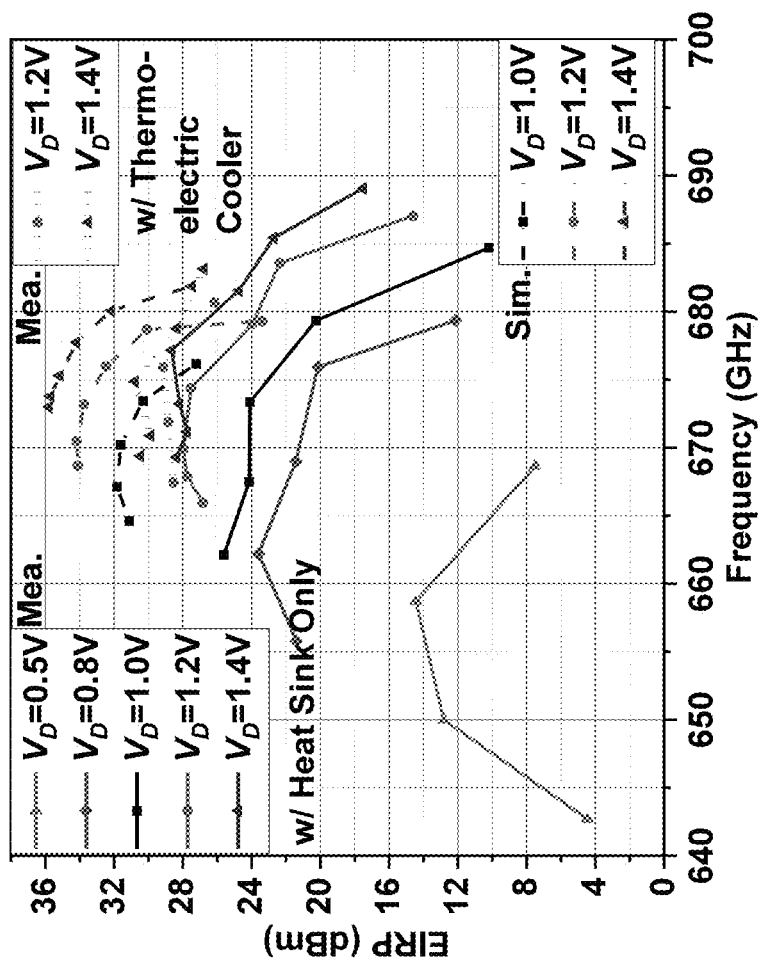
FIG. 20 is a graph showing simulated and measured effective isotropic radiated power (EIRP) of the 12×12 coupled oscillator array of FIG. 15.

The two thermal images in FIG. 17 compare the operating temperature of the chip of the 12×12 coupled oscillator array under peak power consumption using the two heat dissipation methods (one method uses only heat sink (the lower thermal image), another method uses heat sink as well as thermoelectric cooler and fan (the upper thermal image)). The lowered operating temperature can lead to higher output power and hence higher EIRP, as shown in FIG. 20. In this example, by using the thermoelectric cooler and fan, EIRP improvement of about 2 dBm can be obtained. In this example, the measured peak EIRP is 30.8 dBm at 674.9 GHz.

Figure 21A:
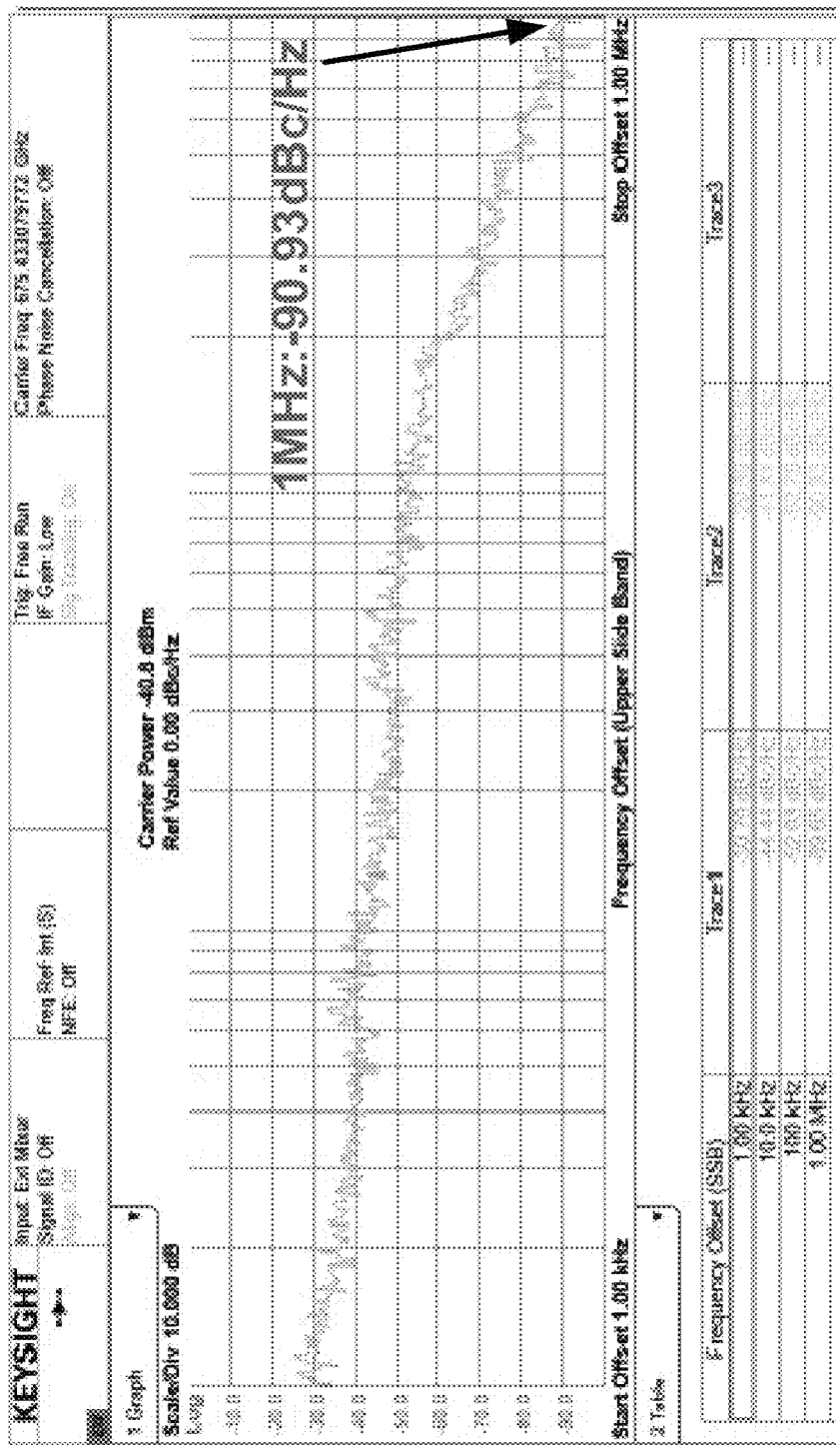
FIG. 21A is a graph showing measured phase noise of the 12×12 coupled oscillator array of FIG. 15 at 675 GHz.
Figure 21B:
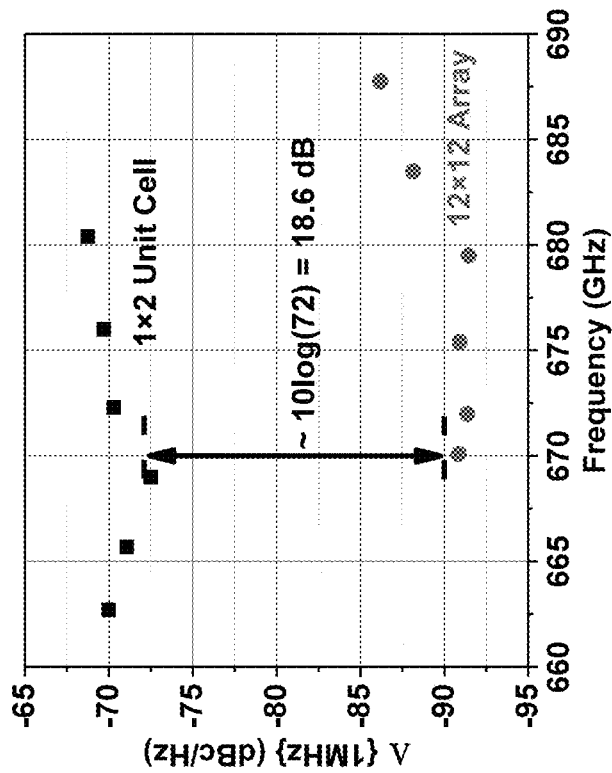
FIG. 21B is a graph showing measured phase noise (at 1 MHz offset) of the 12×12 coupled oscillator array of FIG. 15 and the 1×2 unit cell of FIG. 16.

In one measurement, the phase noise is directly measured using the spectrum analyzer. FIG. 21A shows the measured phase noise of the chip of the 12×12 coupled oscillator array at 675 GHz. FIG. 21B shows measured phase noises at 1 MHz offset at different frequencies. For comparison, the phase noise performance of the fabricated 1×2 unit cell is also measured, and the results for different frequencies are also shown in FIG. 21B. It can be seen that, compared to the 1×2 unit cell, the phase noise improvement of the 12×12 array is close to the theoretical value.

The motorized rotary stage in the measurement setup in FIG. 17 is used for facilitating radiation pattern measurement.

Figure 22B:
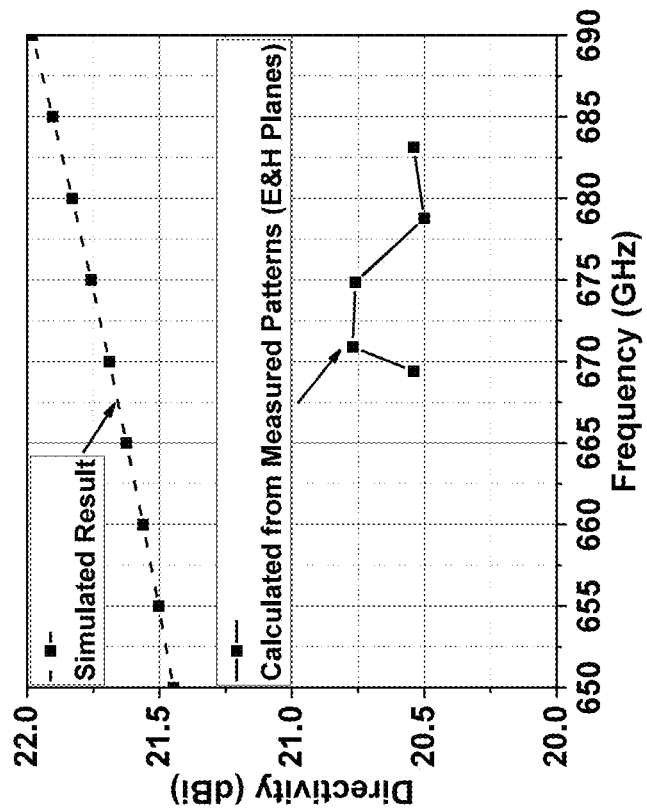
FIG. 22B is a graph showing simulated and calculated directivities of the 12×12 coupled oscillator array of FIG. 15.
Figure 22A:
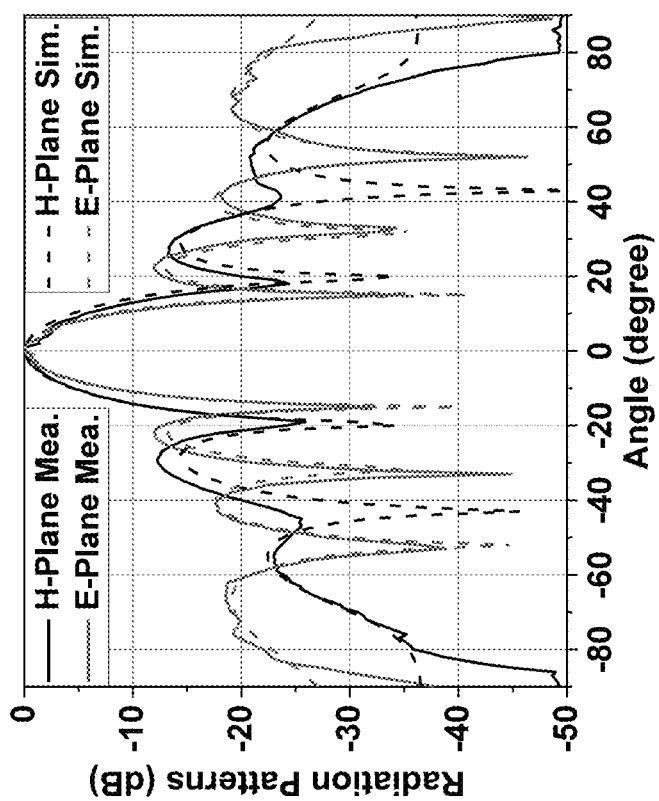
FIG. 22A is a graph showing simulated and measured radiation pattern (E- and H-plane patterns) of the 12×12 coupled oscillator array of FIG. 15 at 675 GHz.

FIG. 22A shows the simulated and measured radiation patterns (E- and H-plane patterns) of the chip of the 12×12 coupled oscillator array at 675 GHz. It can be seen that the results are in good agreement, especially for the patterns in the E-plane. In this example, as the coupling strength of the coupled oscillator array in the E-plane is high, the phase error due to the device mismatch is not obvious, and so the array can maintain a relatively ideal out-of-phase coupling mode in that plane. In this example, in contrast, the coupling strength is weaker for the in-phase coupling mode due to the smaller injection current, as illustrated in the equivalent circuit in FIG. 5.

Figure 23B:
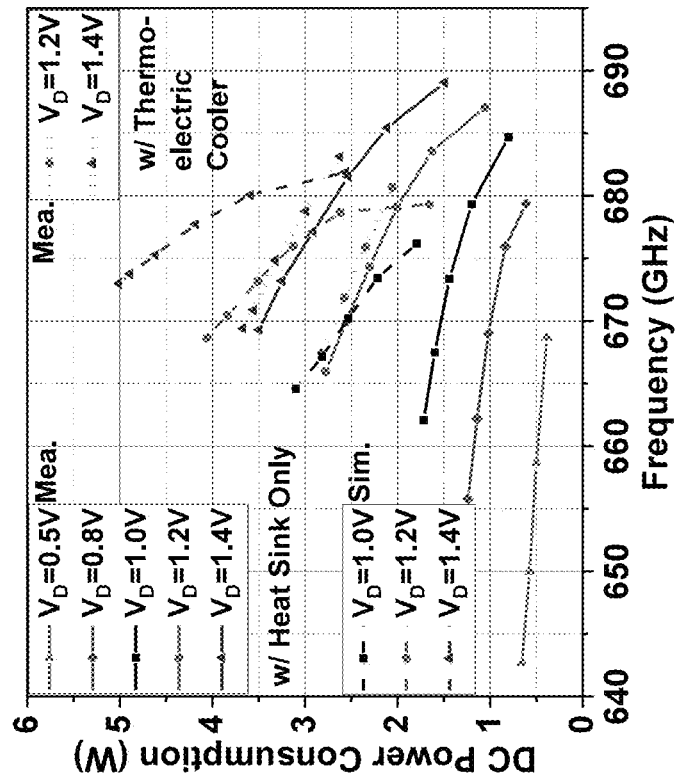
FIG. 23B is a graph showing simulated and measured DC power consumption of the 12×12 coupled oscillator array of FIG. 15.
Figure 23A:
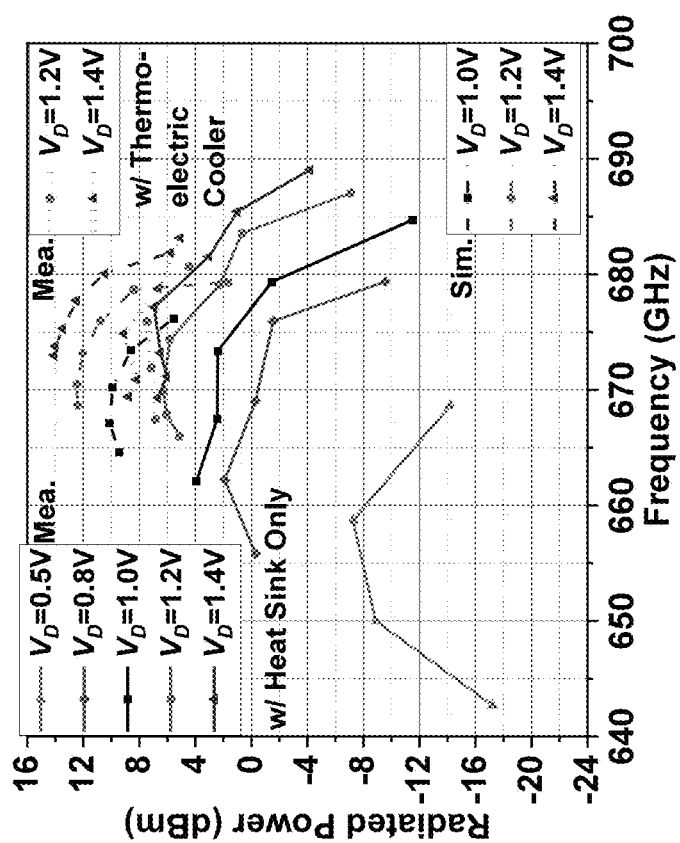
FIG. 23A is a graph showing simulated and measured radiated power of the 12×12 coupled oscillator array of FIG. 15.

Based on the measured E- and H-plane patterns at different frequencies, the corresponding directivities are calculated and compared with the simulated values. FIG. 22B shows simulated and calculated directivities of the chip of the 12×12 coupled oscillator array. It is found that the calculated directivities from the measured two planes are about 1 dB lower compared to the corresponding simulated values, which is different from the well-matched patterns as illustrated in FIG. 22A. In this example, the simulated directivity is calculated based on the whole 3D radiation field distribution but the calculated directivity is an average result of only two measured planes, thus this may result in error, especially with different beamwidths in the two planes. Therefore, using the simulated directivity for radiated power calculation can be more accurate, and in this example a simulated directivity of 21.7 dB at 670 GHz is used. Then, the measured radiated power of the chip of the 12×12 coupled oscillator array is calculated and shown in FIG. 23A. The peak radiated power is 9.1 dBm at 674.9 GHz. The simulated and measured power consumption of the chip of the 12×12 coupled oscillator array is shown in FIG. 23B. It is found that the simulated DC power consumption is higher than the measurement result under the same supply voltage, and the measured power consumption under $V_D$=1.4V is close to the simulated results with $V_D$=1.2V. The reason for this may be the voltage drop in the bonding wires, as the DC current can be as high as 2.6 A. In this example the supply voltage $V_D$ is measured on the printed circuit board (PCB), and the voltage drop in the bonding wires will lead to a smaller voltage applied to the transistor. Apart from inaccuracy of the model, the voltage drop issue may also account for the difference between simulation and measurement in EIRP.

In this embodiment, tuning the bias voltage of the peripheral subarrays ($V_{G1}$ or $V_{G4}$) can effectively change the stable phase relationship, as verified by the simulated phase in FIG. 24A, in which $V_{G4}$ is set at 0.8V and the remaining subarrays are kept at 1V. Thus, the radiation beam in the H-plane can be steered. $V_{G2}$ and $V_{G3}$ are slightly adjusted in the measurement, and the measured radiation patterns and corresponding bias configuration are shown in FIGS. 24B and 24C. It is found that in this example the radiation beam in the H plane can be scanned from −45° to +450 (5 dB degradation).

Some of the above embodiments of the invention have provided a differentially-fed, patch-antenna-based 2D scalable array with beamforming function and high dc-to-THz conversion efficiency. One example embodiment of the invention has provided a 12×12 coupled oscillator array chip, which occupies a 2 mm×1.7 mm area, and can operate between 643 GHz and 689 GHz (6.9%) and radiate a peak power of 9.1 dBm with 3.32-W power consumption (which implies a 0.245% dc-to-THz efficiency at 675 GHz). In that example embodiment, the corresponding lensless EIRP is 30.8 dBm, and the measured phase noise at 1 MHz offset is −90.9 dBc/Hz. In that example embodiment, the beam can be steered from −45° to 45° in the H-plane. Table I lists the various performance and characteristics of the coherent terahertz radiator array in silicon in one example embodiment of the invention. The embodiment provides a high-frequency beam-steerable IC, a silicon-based coherent THz radiator arrays beyond 300 GHz, which can radiate high power and EIRP with high efficiency.

for implementing a large-scale array. It should be noted that some embodiments of the invention may include one or more additional or alternative advantages not specifically described or illustrated.

TABLE I

Performance or characteristics of a coherent terahertz radiator array in silicon in one embodiment

| Radiating Element & Array Size | Beam Steering (°) | Frequency ($f_o$) (GHz) | Tuning Range (%) | Supply Voltage (V) | EIRP (dBm) | $P_{rad}$ (dBm) | $P_{DC}$ (W) | DC-to-THz Efficiency (%) | ${X MHz}$ (dBc/Hz) | Area (mm$^2$) | $P_{rad}$/Area (mW/mm$^2$) | Technology |
|---|---|---|---|---|---|---|---|---|---|---|---|---|
| Differentially fed patch antenna (12 × 12) | 90 | 675.9 674.9 643-689 | 6.9 | 1.2 1.4 | 29.1 30.8 | 7.4 9.1 | 2.345 3.320 | 0.237 0.245 | −90.93 (1 MHz) | 2.7 (Core) 3.4 (Full) | 1.63 2.39 | 65-nm CMOS |

Some embodiments of the invention have provided a large-scale coherent terahertz (THz) source array with multiple coupled oscillator elements. Some embodiments of the invention have provided a 2D scalable coupling topology suitable for large array formation to enable the desired coherent oscillation mode, in which a differential patch antenna can be incorporated, radiating the third harmonic for high output frequency beyond 600 GHz without requiring a lens. Some of the disclosure relates to the study on the nonlinear operation of a transistor for finding optimum operating state for boosting the third harmonic output. Some of the disclosure relates to design of the oscillator based on the determined optimum condition. In some embodiments of the invention, the input impedance of the antenna is matched to the optimum value for harmonic boost and high-efficiency harmonic power extraction from the transistor. The design in some embodiments of the invention is capable of beam steering by changing the bias voltage to establish different phase gradients across the array.

Some embodiments of the invention may include one or more of the following example functions and applications. For example, some embodiments of the invention provide a high-power terahertz electromagnetic radiation source that can be used for terahertz applications such as high-speed wireless data transmission, spectroscopy, imaging, and radar. For example, some embodiments of the invention use relatively low-cost CMOS technology to generate and radiate high-power and high-frequency terahertz signals. For example, some embodiments of the invention can be implemented as part of an active terahertz imaging system to illuminate targeted objects, and the beam-steerable function can reduce the imaging time. Some embodiments of the invention provide a THz source with steerable radiation beam. Some embodiments of the invention can be used for 5G, 6G or above wireless communication, e.g., for more than 100 Gbps data rate data transmission. Some embodiments of the invention can be used for THz imaging. Some embodiments of the invention can replace existing commercial THz extender as the source. It should be noted that some embodiments of the invention may include one or more additional or alternative functions and/or applications not specifically described or illustrated.

Some embodiments of the invention may include one or more of the following example advantages. For example, the radiator unit or radiator in some embodiments may provide improved DC to terahertz conversion efficiency. For example, the topology of the radiator unit array in some embodiments of the invention may be scalable or suitable The radiator of the invention can be provided in or included in an integrated circuit. The integrated circuit may be included in a device. The device with the radiator may also include a thermal management device thermally coupled with the radiator for regulating temperature of the radiator (e.g., for facilitating heat dissipation from the radiator). For example, the thermal management device may be coupled to a side (e.g., back side) of the integrated circuit. For example, the thermal management device may include a passive thermal management device (e.g., heat sink with fins, pins, etc.) and/or an active thermal management device (e.g., a fan, a liquid-based heat exchange device, an evaporative heat exchanger, etc.). The device with the radiator may lack any lens disposed relative to the radiator for affecting (e.g., boosting) directivity of the terahertz electromagnetic radiation provided by the radiator. The radiator, the integrated circuit, or the device may be included in a system for providing terahertz electromagnetic radiation. The system may be a sensing system, a communication system, a spectroscopic system, an imaging system, etc. The system may be an active terahertz imaging system arranged to illuminate objects (e.g., targeted objects). The system may be a cellular (e.g., 5G, 6G, above 6G, or the like) communication system.

It will be appreciated by a person skilled in the art that variations and/or modifications may be made to the described and/or illustrated embodiments of the invention to provide other embodiments of the invention. The described/or illustrated embodiments of the invention should therefore be considered in all respects as illustrative, not restrictive. Example optional features of some embodiments of the invention are provided in the summary and the description. Some embodiments of the invention may include one or more of these optional features. Some embodiments of the invention may lack one or more of these optional features. For example, one or more of the shape, size, configuration, orientation, etc., of the components of the radiator or radiator unit may be different from illustrated.

The invention claimed is:

1. A radiator for terahertz electromagnetic radiation, comprising:
one or more radiator units each respectively comprising:
an oscillator arrangement operable to generate third harmonic power, the oscillator arrangement comprising:
a first oscillator operable to generate third harmonic power;
a second oscillator operable to generate third harmonic power; and a coupler electrically coupling the first oscillator and the second oscillator; wherein the coupler comprises an even-mode-shorted coupler for enabling or sustaining an out-of-phase coupling mode between the first oscillator and the second oscillator; and a patch antenna arrangement operably coupled with the oscillator arrangement for radiating terahertz electromagnetic radiation based on the generated third harmonic power.

2. The radiator of claim 1, wherein the even-mode-shorted coupler comprises:
   a transmission line arrangement electrically connected between the first oscillator and the second oscillator, and
   a capacitive arrangement electrically connected with the transmission line arrangement and operable to facilitate shorting of even-mode impedance.

3. The radiator of claim 1, wherein the first oscillator and the second oscillator are arranged to differentially feed the patch antenna arrangement.

4. The radiator of claim 1, wherein the one or more radiator units include a plurality of radiator units operably coupled with each other.

5. The radiator of claim 4,
   wherein the plurality of radiator units comprises, at least, a first radiator unit and a second radiator unit arranged in the same row; and
   wherein the radiator comprises a coupling arrangement electrically coupling the first radiator unit and the second radiator unit.

6. The radiator of claim 4,
   wherein the plurality of radiator units comprises, at least, a first radiator unit and a second radiator unit arranged in adjacent rows; and
   wherein the radiator comprises a coupling arrangement electrically coupling the first radiator unit and the second radiator unit in adjacent rows.

7. The radiator of claim 4,
   wherein the plurality of radiator units are arranged in an array with a plurality of rows each including at least one radiator unit;
   wherein the array comprises a plurality of subarrays each including some of the plurality of rows;
   wherein each of the plurality of subarrays is arranged to be subjected to a respective bias voltage.

8. An integrated circuit comprising at least one of the radiator of claim 1.

9. A radiator for terahertz electromagnetic radiation, comprising:
   one or more radiator units each respectively comprising:
      an oscillator arrangement operable to generate third harmonic power; and
      a patch antenna arrangement operably coupled with the oscillator arrangement for radiating terahertz electromagnetic radiation based on the generated third harmonic power;
   wherein the oscillator arrangement comprises:
      a first oscillator operable to generate third harmonic power;
      a second oscillator operable to generate third harmonic power; and
      a coupler electrically coupling the first oscillator and the second oscillator;
   wherein each of the first oscillator and the second oscillator respectively comprises:
      a first transistor with a gate terminal, a source terminal, and a drain terminal; and
      a second transistor with a gate terminal, a source terminal, and a drain terminal;
   wherein the first transistor and the second transistor are operably coupled to operate in phase.

10. The radiator of claim 9,
    wherein the gate terminal of the first transistor and the gate terminal of the second transistor are electrically connected with each other; and/or
    wherein the source terminal of the first transistor and the source terminal of the second transistor are electrically connected with each other.

11. The radiator of claim 9, wherein each of the first oscillator and the second oscillator respectively further comprises:
    a first circuit arrangement electrically connected with the source terminal of the first transistor;
    a second circuit arrangement electrically connected with the source terminal of the second transistor;
    a third circuit arrangement electrically connected with the drain terminal of the first transistor and operably coupled with the patch antenna arrangement; and
    a fourth circuit arrangement electrically connected with the drain terminal of the second transistor and operably coupled with the patch antenna arrangement.

12. The radiator of claim 11, wherein the first circuit arrangement comprises:
    a capacitive arrangement for facilitating oscillation; and
    a transmission line arrangement for power supply;
    wherein the capacitive arrangement and the transmission line arrangement of the first circuit arrangement are arranged electrically in parallel.

13. The radiator of claim 12,
    wherein the capacitive arrangement of the first circuit arrangement is grounded; and
    wherein the transmission line arrangement of the first circuit arrangement is grounded and comprises a curved transmission line.

14. The radiator of claim 11, wherein the second circuit arrangement comprises:
    a capacitive arrangement for facilitating oscillation; and
    a transmission line arrangement for power supply;
    wherein the capacitive arrangement and the transmission line arrangement of the second circuit arrangement are arranged electrically in parallel.

15. The radiator of claim 14,
    wherein the capacitive arrangement of the second circuit arrangement is grounded; and
    wherein the transmission line arrangement of the second circuit arrangement is grounded and comprises a curved transmission line.

16. The radiator of claim 11, wherein the third circuit arrangement comprises:
    a transmission line arrangement operably coupled with the patch antenna arrangement; and
    an AC short termination arrangement electrically connected with the transmission line arrangement.

17. The radiator of claim 16, wherein the transmission line arrangement of the third circuit arrangement comprises:
    a first transmission line portion with an end electrically connected in series with the AC short termination arrangement, to enable application of a DC supply voltage between the first transmission line portion and the AC short termination arrangement; and a second transmission line portion extending from the first transmission line portion and electrically coupled with the patch antenna arrangement for capacitively feeding the patch antenna arrangement.

18. The radiator of claim 11, wherein the fourth circuit arrangement comprises:
a transmission line arrangement operably coupled with the patch antenna arrangement; and
an AC short termination arrangement electrically connected with the transmission line arrangement.

19. The radiator of claim 18, wherein the transmission line arrangement of the fourth circuit arrangement comprises:
a first transmission line portion with an end electrically connected in series with the AC short termination arrangement, to enable application of a DC supply voltage between the first transmission line portion and the AC short termination arrangement; and
a second transmission line portion extending from the first transmission line portion and electrically coupled with the patch antenna arrangement for capacitively feeding the patch antenna arrangement.

20. The radiator of claim 11, wherein the patch antenna arrangement comprises:
a first patch element operably coupled with the first oscillator and the second oscillator; and
a second patch element operably coupled with the first oscillator and the second oscillator.

21. The radiator of claim 20,
wherein the first patch element is electrically coupled with the third circuit arrangement of the first oscillator and the third circuit arrangement of the second oscillator; and/or
wherein the second patch element is electrically coupled with the fourth circuit arrangement of the first oscillator and the fourth circuit arrangement of the second oscillator.

22. The radiator of claim 21,
wherein the first transistor of the first oscillator and the first transistor of the second oscillator are arranged to selectively or alternately provide third harmonic power to the first patch element; and/or
wherein the second transistor of the first oscillator and the second transistor of the second oscillator are arranged to selectively or alternately provide third harmonic power to the second patch element.

23. A radiator for terahertz electromagnetic radiation, comprising:
one or more radiator units each respectively comprising:
an oscillator arrangement operable to generate third harmonic power; and
a patch antenna arrangement operably coupled with the oscillator arrangement for radiating terahertz electromagnetic radiation based on the generated third harmonic power;
wherein the oscillator arrangement comprises:
a first oscillator operable to generate third harmonic power;
a second oscillator operable to generate third harmonic power; and
a coupler electrically coupling the first oscillator and the second oscillator;
wherein the one or more radiator units include a plurality of radiator units operably coupled with each other; the plurality of radiator units comprising, at least, a first radiator unit and a second radiator unit arranged in the same row; and
wherein the radiator comprises a coupling arrangement electrically coupling the first radiator unit and the second radiator unit; and
wherein the coupling arrangement comprises an even-mode-shorted coupler for enabling or sustaining an out-of-phase coupling mode between (i) the first oscillator of one of the first radiator unit and the second radiator unit and (ii) the second oscillator of another one of the first radiator unit and the second radiator unit.

24. The radiator of claim 23, wherein the even-mode-shorted coupler of the coupling arrangement comprises:
a transmission line arrangement electrically connected between (i) the first oscillator of one of the first radiator unit and the second radiator unit and (ii) the second oscillator of another one of the first radiator unit and the second radiator unit, and
a capacitive arrangement electrically connected with the transmission line arrangement and operable to facilitate shorting of an even-mode impedance.

25. A radiator for terahertz electromagnetic radiation, comprising:
one or more radiator units each respectively comprising:
an oscillator arrangement operable to generate third harmonic power; and
a patch antenna arrangement operably coupled with the oscillator arrangement for radiating terahertz electromagnetic radiation based on the generated third harmonic power;
wherein the oscillator arrangement comprises:
a first oscillator operable to generate third harmonic power;
a second oscillator operable to generate third harmonic power; and
a coupler electrically coupling the first oscillator and the second oscillator;
wherein the one or more radiator units include a plurality of radiator units operably coupled with each other; the plurality of radiator units comprising, at least, a first radiator unit and a second radiator unit arranged in adjacent rows; and
wherein the radiator comprises a coupling arrangement electrically coupling the first radiator unit and the second radiator unit in adjacent rows;
wherein the coupling arrangement comprises:
a first coupler electrically connected between the first oscillator of the first radiator unit and the first oscillator of the second radiator unit, and
a second coupler electrically connected between the second oscillator of the first radiator unit and the second oscillator of the second radiator unit.

26. The radiator of claim 25,
wherein the first coupler comprises a first odd-mode-shorted coupler for enabling or sustaining an in-phase coupling mode between the first oscillator of the first radiator unit and the first oscillator of the second radiator unit; and
wherein the second coupler comprises a second odd-mode-shorted coupler for enabling or sustaining an in-phase coupling mode between the second oscillator of the first radiator unit and the second oscillator of the second radiator unit.

27. The radiator of claim 26, wherein the first odd-mode-shorted coupler comprises:
a transmission line arrangement electrically connected between the first oscillator of the first radiator unit and the first oscillator of the second radiator unit;

a first capacitive arrangement electrically connected between the transmission line arrangement and the first oscillator of the first radiator unit and operable to facilitate shorting of an odd-mode impedance; and a second capacitive arrangement electrically connected between the transmission line arrangement and the first oscillator of the second radiator unit and operable to facilitate shorting of an odd-mode impedance.

28. The radiator of claim 26, wherein the second odd-mode-shorted coupler comprises:

a transmission line arrangement electrically connected between the second oscillator of the first radiator unit and the second oscillator of the second radiator unit;

a first capacitive arrangement electrically connected between the transmission line arrangement and the second oscillator of the first radiator unit and operable to facilitate shorting of an odd-mode impedance; and a second capacitive arrangement electrically connected between the transmission line arrangement and the second oscillator of the second radiator unit and operable to facilitate shorting of an odd-mode impedance.

\* \* \* \* \*